(12) United States Patent　(10) Patent No.:　US 12,660,555 B2
Sakamoto et al.　(45) Date of Patent:　Jun. 16, 2026

(54) INSPECTION DEVICE AND INSPECTION METHOD

(71) Applicant: HAMAMATSU PHOTONICS K.K., Hamamatsu (JP)

(72) Inventors: Takeshi Sakamoto, Hamamatsu (JP); Takafumi Ogiwara, Hamamatsu (JP); Iku Sano, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 776 days.

(21) Appl. No.: 17/916,837

(22) PCT Filed: Mar. 31, 2021

(86) PCT No.: PCT/JP2021/013976
§ 371 (c)(1),
(2) Date: Oct. 4, 2022

(87) PCT Pub. No.: WO2021/205963
PCT Pub. Date: Oct. 14, 2021

(65) Prior Publication Data
US 2023/0154774 A1　May 18, 2023

(30) Foreign Application Priority Data
Apr. 6, 2020　(JP) ................................. 2020-068439

(51) Int. Cl.
*H10P 72/00*　(2026.01)
*B23K 26/53*　(2014.01)
(Continued)

(52) U.S. Cl.
CPC .......... *H10P 72/0604* (2026.01); *B23K 26/53* (2015.10); *H10P 74/203* (2026.01); *H10P 74/235* (2026.01)

(58) Field of Classification Search
CPC ... H01L 21/67253; H01L 22/12; H01L 22/24; B23K 26/53
See application file for complete search history.

(56) References Cited

U.S. PATENT DOCUMENTS

2004/0174514 A1*　9/2004　Kawahara ............. G03F 7/7095
355/75
2020/0266104 A1*　8/2020　Furuta .................... B23K 26/08

FOREIGN PATENT DOCUMENTS

CN　1473087 A　2/2004
CN　102307699 A　1/2012
(Continued)

OTHER PUBLICATIONS

International Preliminary Report on Patentability mailed Oct. 20, 2022 for PCT/JP2021/013976.
(Continued)

*Primary Examiner* — Mohammad M Choudhry
(74) *Attorney, Agent, or Firm* — Faegre Drinker Biddle & Reath LLP

(57)　ABSTRACT

An inspection device includes: a laser irradiation unit; an imaging unit; and a control unit. The control unit is configured to execute a processing process of controlling the laser irradiation unit according to a recipe set such that a plurality of modified regions are formed inside a wafer by irradiating the wafer with a laser beam and a full-cut state where cracks extending from the modified regions have reached a back surface and a surface is attained; an identification process of identifying a state of the crack on the back surface extending from the modified region, and a state of at least one of the modified regions and the cracks inside the wafer, based on a signal; and a determination process of determining whether or not a dicing force applied to the wafer according to the recipe is proper, based on information identified in the identification process.

10 Claims, 39 Drawing Sheets

(51) Int. Cl.
  *H10P 74/00* (2026.01)
  *H10P 74/20* (2026.01)

(56) References Cited

FOREIGN PATENT DOCUMENTS

| | | | | | |
|---|---|---|---|---|---|
| CN | 104520973 | A | | 4/2015 | |
| CN | 107363413 | A | | 11/2017 | |
| CN | 107464762 | A | | 12/2017 | |
| CN | 110270769 | A | | 9/2019 | |
| CN | 113508002 | A | * 10/2021 | ....... | H01L 21/02005 |
| JP | 2002-192370 | A | | 7/2002 | |
| JP | 2007-103718 | A | | 4/2007 | |
| JP | 2013-006220 | A | | 1/2013 | |
| JP | 2014-041927 | A | | 3/2014 | |
| JP | 2015012015 | A | * 1/2015 | | |
| JP | 2015-170697 | A | | 9/2015 | |
| JP | 2017-064746 | A | | 4/2017 | |
| JP | 2017-064747 | A | | 4/2017 | |
| JP | 2017-174941 | A | | 9/2017 | |
| JP | 2017-204574 | A | | 11/2017 | |
| JP | 2019-147191 | A | | 9/2019 | |
| JP | 2019-158811 | A | | 9/2019 | |
| KR | 2019-0109264 | A | | 9/2019 | |
| TW | 201637763 | A | | 11/2016 | |
| WO | 02/22301 | A1 | | 3/2002 | |
| WO | WO-2009084489 | A1 | * 7/2009 | ............ | B23K 26/40 |

OTHER PUBLICATIONS

Li et al., "Research Progress on Wafer Laser Cutting Technology", Semiconductor Technology, vol. 42 No. 8, China Academic Journal Electronic Publishing House, Aug. 2017, p. 561-p. 568.

* cited by examiner

*Fig.9*
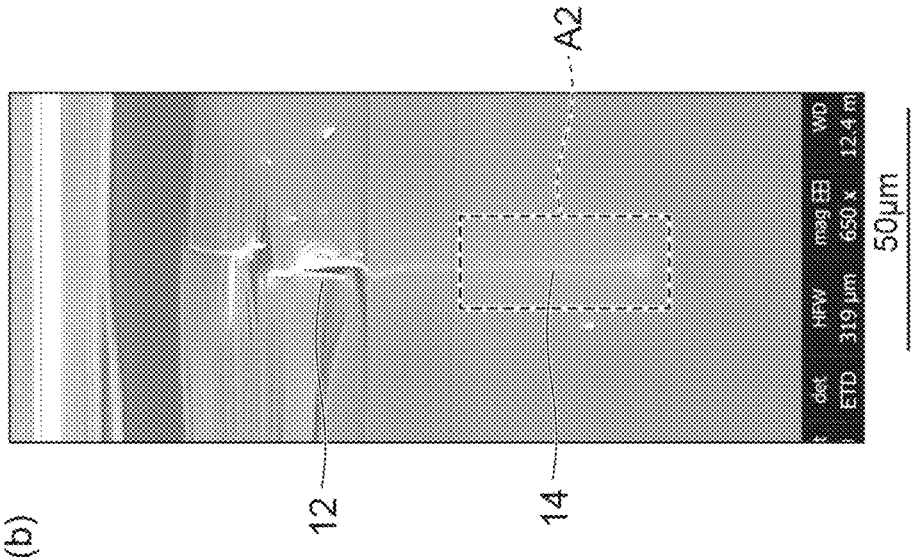
(b)
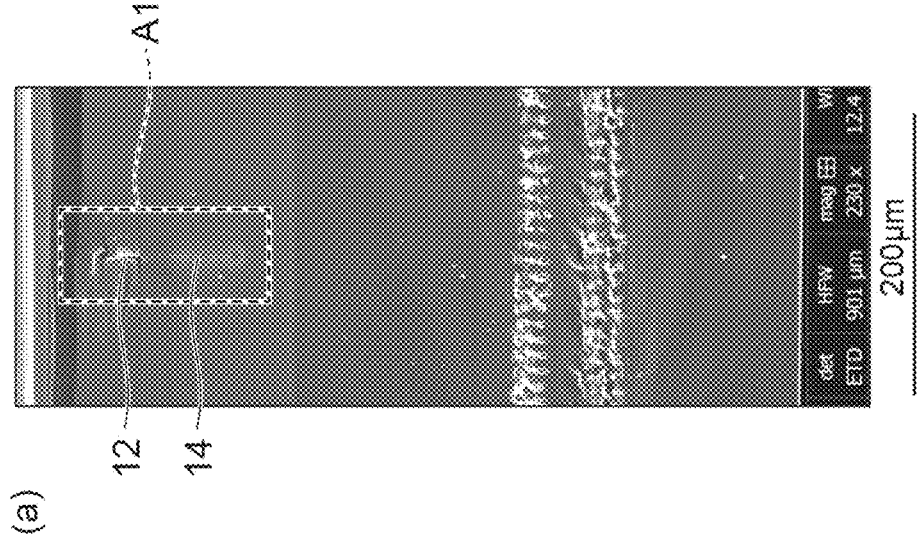
(a)

*Fig.11*
(a)
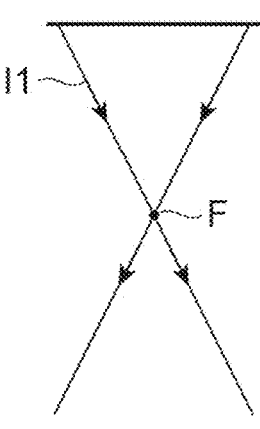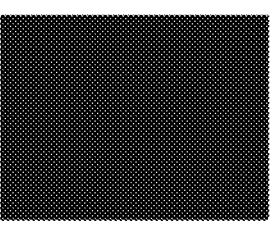
(b)
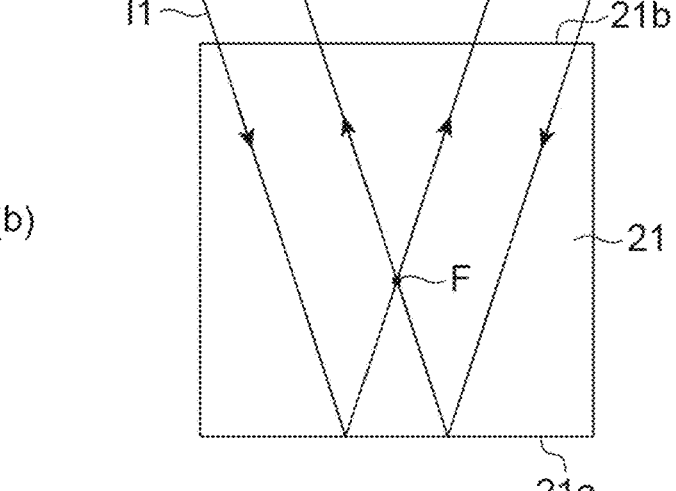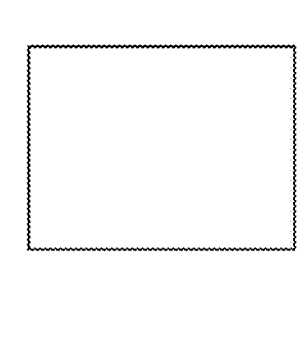
(c)
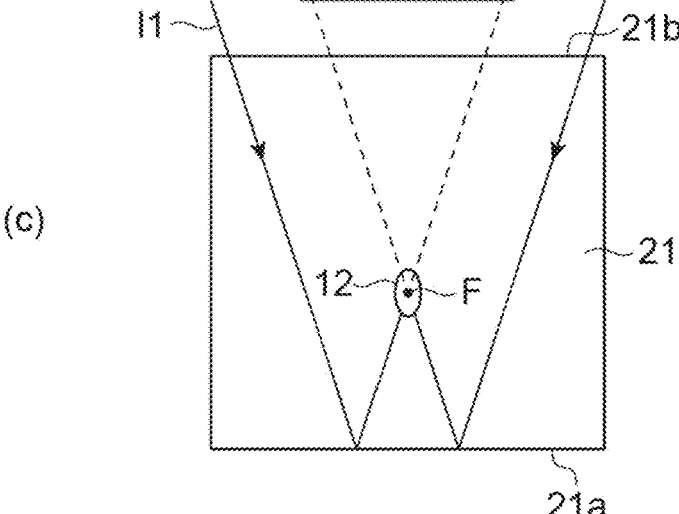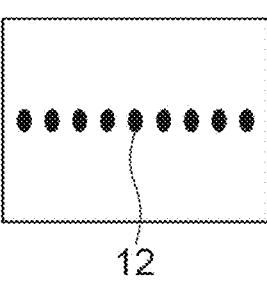

*Fig.12*
(a)
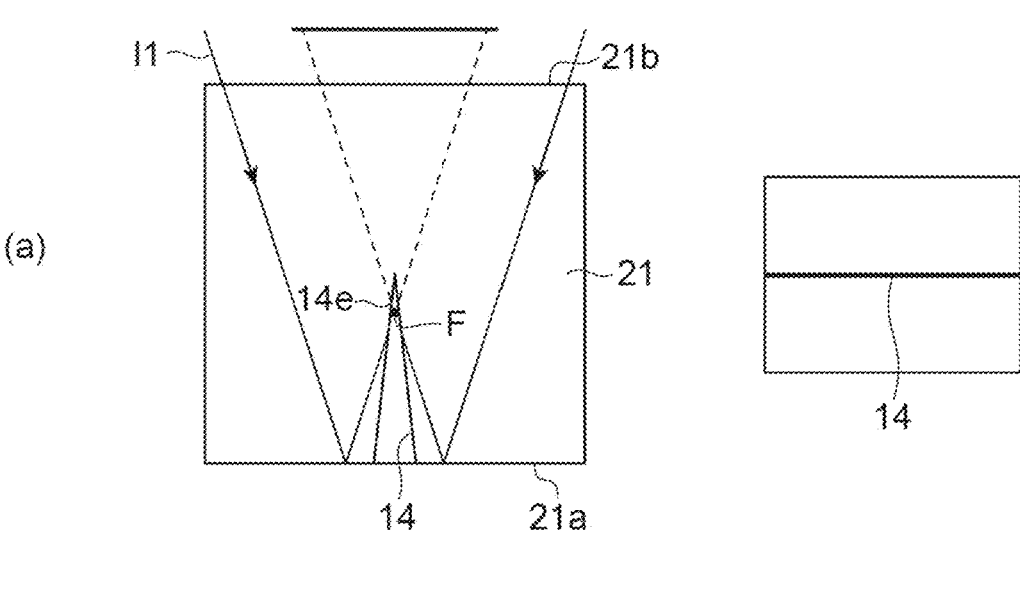
(b)
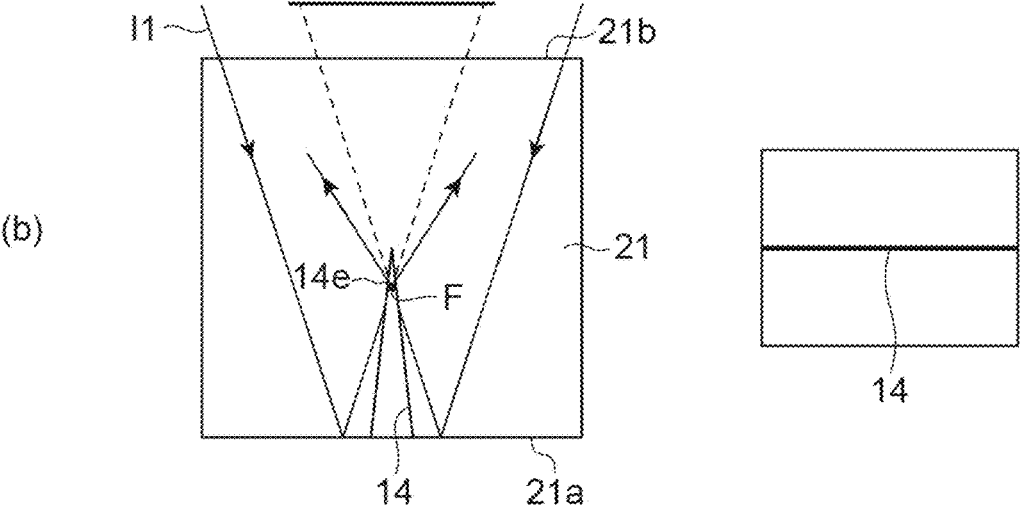
(c)
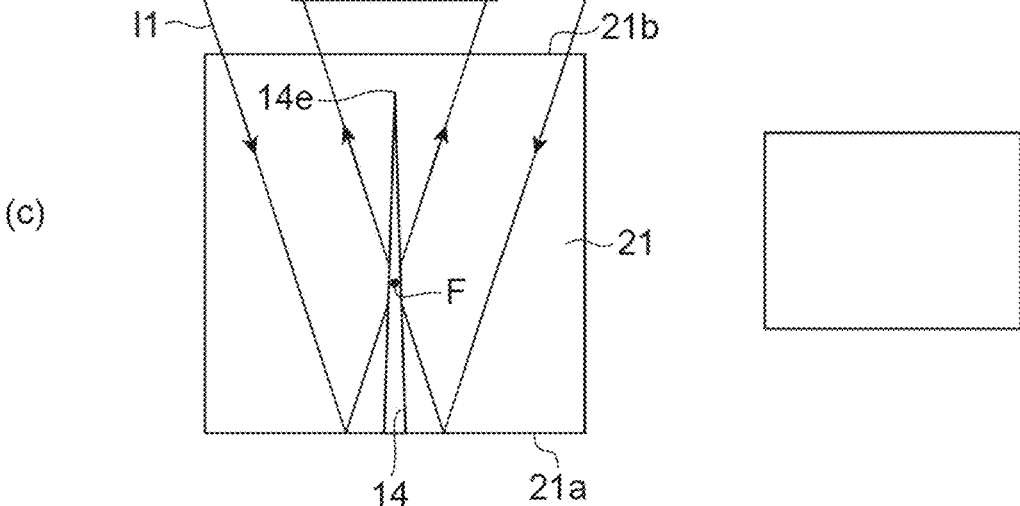

*Fig.14*
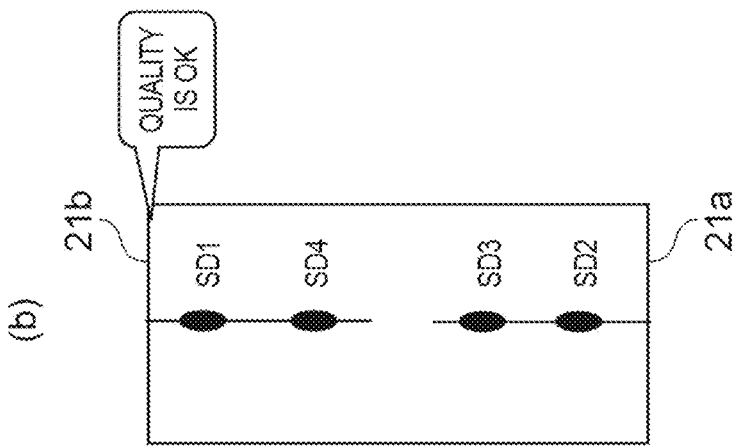
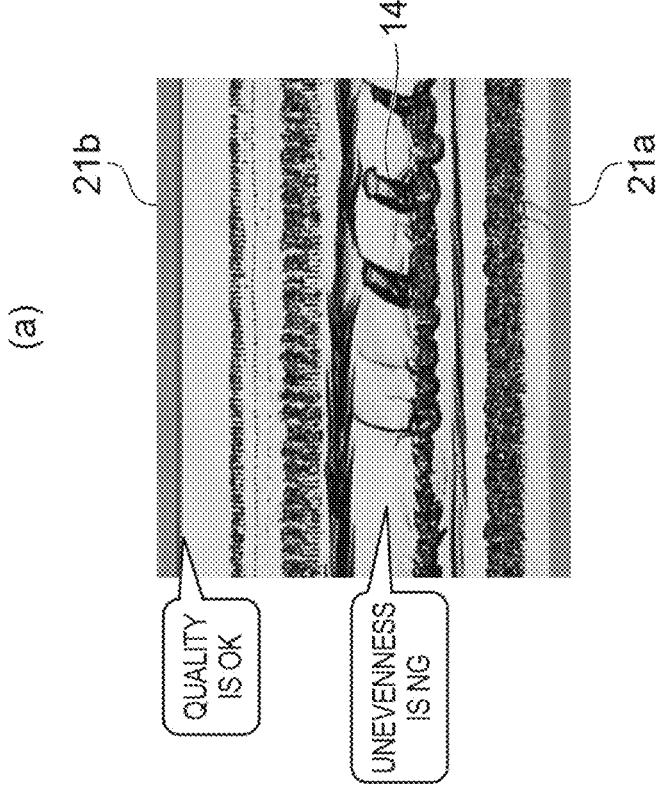

| FC DETERMINATION | EXECUTION | |
|---|---|---|
| WAFER THICKNESS | USER SELECTION | ▽ |
| DEVICE TYPE | USER SELECTION | ▽ |
| PROCESSING SETTING | USER SELECTION | ▽ |

○DETERMINATION CONTENTS

| FC DETERMINATION | EXECUTION | WAFER THICKNESS | t400μm |
|---|---|---|---|
| PROCESSING SETTING | T400 μm CONDITION(1) | DEVICE TYPE | No.1 |

○DETERMINATION CRITERIA

LASER INCIDENT SURFACE INSPECTION

| CRACK STATE OF INCIDENT SURFACE | HC | |
|---|---|---|
| HC STRAIGHTNESS | LESS THAN 6μm | ▽ |

WAFER INTERNAL INSPECTION

| CRACK STATE OF INCIDENT BACK SURFACE | BHC(FC) | |
|---|---|---|
| END SURFACE UNEVENNESS POSITION | BETWEEN SD3 AND SD4 | ▽ |
| END SURFACE UNEVENNESS WIDTH (μm) | LESS THAN 6μm | ▽ |
| MARK OBSERVATION | VAGUE (FC) | |

| OPROCESSING CONDITION | | | | | | | | |
|---|---|---|---|---|---|---|---|---|
| PROCESSING NUMBER | FOUR | ▽ | | | | | | |

| | FIRST PASS | | SECOND PASS | | THIRD PASS | | FOURTH PASS | |
|---|---|---|---|---|---|---|---|---|
| ZH($\mu$m) | 80 | ▽ | 57 | ▽ | 26 | ▽ | 12 | ▽ |
| VD($\mu$m) | 11 | ▽ | - | ▽ | - | ▽ | - | ▽ |
| NUMBER OF FOCUSES | 2 | ▽ | 1 | ▽ | 1 | ▽ | 1 | ▽ |
| PULSE ENERGY LEVEL | 15 | ▽ | 15 | ▽ | 15 | ▽ | 13 | ▽ |
| CONDENSING STATE PARAMETER | 0 | ▽ | -51 | ▽ | -20 | ▽ | -6 | ▽ |
| PROCESSING SPEED (mm/sec) | 490 | ▽ | 490 | ▽ | 490 | ▽ | 490 | ▽ |
| FREQUENCY (kHz) | 100 | ▽ | 100 | ▽ | 100 | ▽ | 100 | ▽ |
| PULSE WIDTH LEVEL | 4 | ▽ | 4 | ▽ | 4 | ▽ | 4 | ▽ |

| OPROCESSING CONDITION | | | | | | | | |
|---|---|---|---|---|---|---|---|---|
| PROCESSING NUMBER | FOUR ▽ | | | | | | | |
| | FIRST PASS | | SECOND PASS | | THIRD PASS | | FOURTH PASS | |
| ZH(μm) | 80 | ▽ | 57 | ▽ | 26 | ▽ | 12 | ▽ |
| VD(μm) | 11 | ▽ | - | ▽ | - | ▽ | - | ▽ |
| NUMBER OF FOCUSES | 2 | ▽ | 1 | ▽ | 1 | ▽ | 1 | ▽ |
| PULSE ENERGY LEVEL | 15 | ▽ | 15 | ▽ | 15 | ▽ | 13 | ▽ |
| CONDENSING STATE PARAMETER | 0 | ▽ | -51 | ▽ | -20 | ▽ | -6 | ▽ |
| PROCESSING SPEED (mm/sec) | 490 | ▽ | 490 | ▽ | 490 | ▽ | 490 | ▽ |
| FREQUENCY (kHz) | 100 | ▽ | 100 | ▽ | 100 | ▽ | 100 | ▽ |
| PULSE WIDTH LEVEL | 3 | ▽ | 3 | ▽ | 4 | ▽ | 4 | ▽ |

*Fig.24*

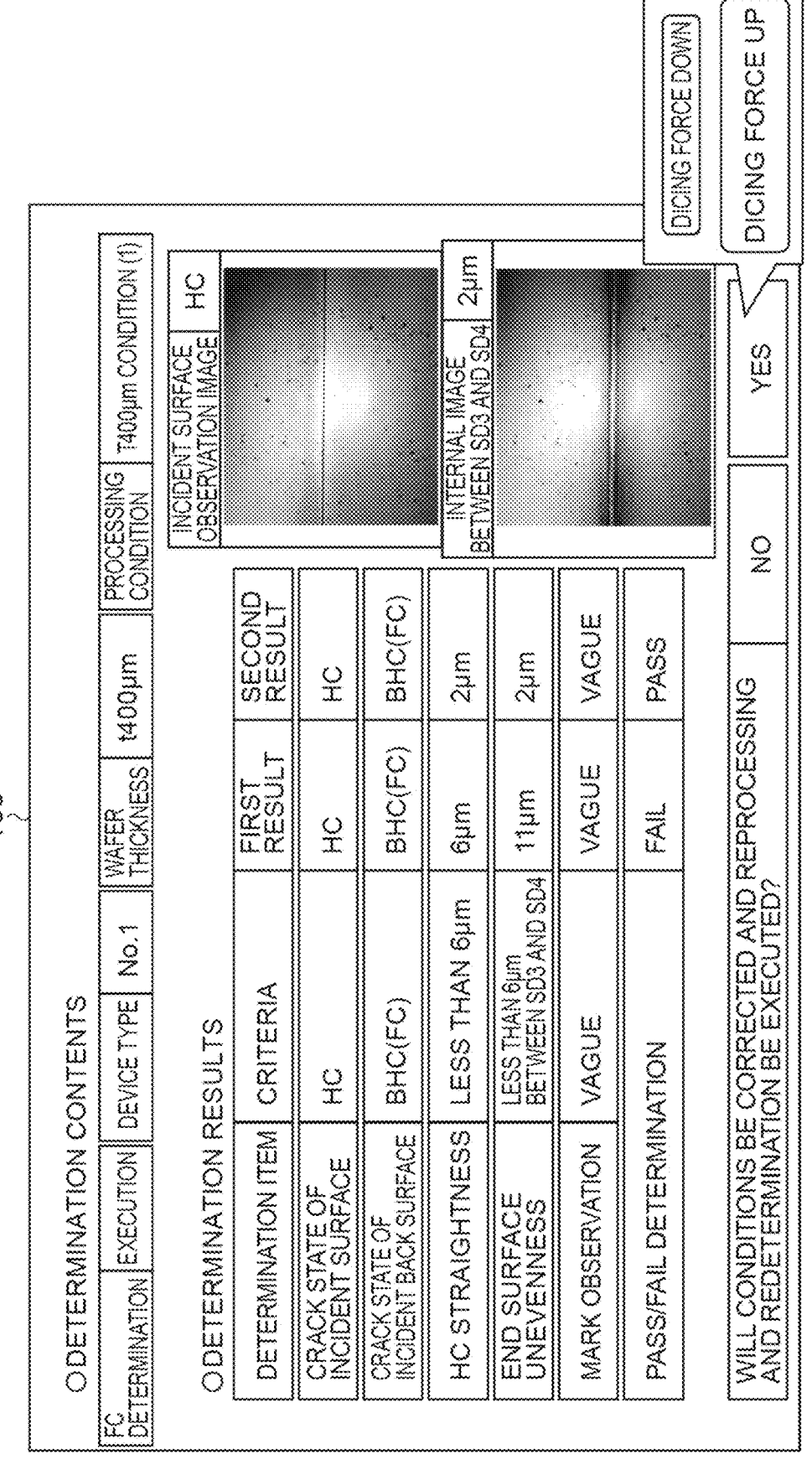

○DETERMINATION CONTENTS

| FC DETERMINATION | EXECUTION | DEVICE TYPE | No.1 | WAFER THICKNESS | t400μm | PROCESSING CONDITION | t400μm CONDITION (1) |

○DETERMINATION RESULTS

| DETERMINATION ITEM | CRITERIA | FIRST RESULT | SECOND RESULT |
|---|---|---|---|
| CRACK STATE OF INCIDENT SURFACE | HC | HC | HC |
| CRACK STATE OF INCIDENT BACK SURFACE | BHC(FC) | BHC(FC) | BHC(FC) |
| HC STRAIGHTNESS | LESS THAN 6μm | 6μm | 2μm |
| END SURFACE UNEVENNESS | LESS THAN 6μm BETWEEN SD3 AND SD4 | 11μm | 2μm |
| MARK OBSERVATION | VAGUE | VAGUE | VAGUE |
| PASS/FAIL DETERMINATION | VAGUE | FAIL | PASS |

INCIDENT SURFACE OBSERVATION IMAGE　HC

INTERNAL IMAGE BETWEEN SD3 AND SD4　2μm

DICING FORCE DOWN

DICING FORCE UP

WILL CONDITIONS BE CORRECTED AND REPROCESSING AND REDETERMINATION BE EXECUTED?　　NO　　YES

◯ DETERMINATION CONTENTS

| FC-1 PASS DETERMINATION + FC DETERMINATION | EXECUTION | WAFER THICKNESS | t400μm |
|---|---|---|---|
| PROCESSING SETTING | T400μm CONDITION (1) | DEVICE TYPE | No.1 |

◯ DETERMINATION CRITERIA

| END SURFACE UNEVENNESS | LESS THAN 6μm | ▽ |
|---|---|---|
| MARK OBSERVATION | DISTINCT | ▽ |
| NUMBER OF BLACK STREAKS | ONE | ▽ |
| BLACK STREAK POSITION | BETWEEN SD3 AND SD4 | ▽ |
| BHC INSPECTION | BHC | ▽ |
| EACH SD LAYER POSITION | CALCULATION FROM DB (STANDARD ±10μm) | ▽ |
| INCIDENT SURFACE STATE | ST | ▽ |

(a)    140  (b)

(a)

(b)  250

(a)

SD PROCESSING (b)

(c)

INSPECTION DEVICE AND INSPECTION METHOD

TECHNICAL FIELD

One aspect of the present invention relates to an inspection device and an inspection method.

BACKGROUND ART

There has been known an inspection device that, in order to cut a wafer including a semiconductor substrate and a functional element layer along each of a plurality of lines, irradiates the wafer with a laser beam from the other surface side of the semiconductor substrate to form a plurality of rows of modified regions inside the semiconductor substrate along each of the plurality of lines, the functional element layer being formed on one surface of the semiconductor substrate. An inspection device disclosed in Patent Literature 1 includes an infrared camera, and can observe modified regions formed inside a semiconductor substrate, processing damage formed in a functional element layer, and the like from a back surface side of the semiconductor substrate.

CITATION LIST

Patent Literature

Patent Literature 1: Japanese Unexamined Patent Publication No. 2017-64746

SUMMARY OF INVENTION

Technical Problem

The inspection device described above may form the modified regions to attain a state where cracks extending from the modified regions extend to both end surfaces of the wafer (full-cut state), in respect to a user's request. For example, the states of both the end surfaces of the wafer are observed to determine whether or not the full-cut state is attained. Here, for example, the states of both the end surfaces of the wafer are observed to determine whether or not the full-cut state is attained, but at the time of inspection, it cannot be determined whether or not the inside of the wafer in the full-cut state is in an appropriate state (whether or not the quality is maintained). Therefore, it may not be possible to sufficiently ensure the quality of the wafer to be processed into the full-cut state.

One aspect of the present invention is conceived in view of the above circumstances, and an object of the present invention is to provide an inspection device and an inspection method that can ensure the quality of a wafer to be processed into a full-cut state.

Solution to Problem

An inspection device according to one aspect of the present invention includes: an irradiation unit that irradiates a wafer having a first surface and a second surface with a laser beam from a first surface side of the wafer; an imaging unit that outputs light having a property of transmitting through the wafer, and that detects the light that has propagated through the wafer; and a control unit. The control unit is configured to execute a first process of controlling the irradiation unit according to a processing condition set such that one or a plurality of modified regions are formed inside the wafer by irradiating the wafer with the laser beam and a full-cut state where cracks extending from the modified regions have reached the first surface and the second surface is attained; a second process of identifying a state of the crack on the first surface extending from the modified region, and a state of at least one of the modified regions and the cracks inside the wafer, based on a signal output from the imaging unit that has detected the light; and a third process of determining whether or not a dicing force applied to the wafer according to the processing condition is proper, based on information identified in the second process.

The inspection device according to one aspect of the present invention applies the laser beam according to the processing condition set to attain the full-cut state where the cracks extending from the modified regions have reached the first surface and the second surface of the wafer. Then, the state of the crack on the first surface and the state of at least one of the modified regions and the cracks inside the wafer are identified, and it is determined whether or not the dicing force applied to the wafer according to the processing condition is proper, based on the identified information. As described above, since in addition to the state of the crack on the first surface that is an incident surface of the laser beam, the state of at least one of the modified regions and the cracks inside the wafer are identified, in consideration of not only information regarding an end surface (first surface) of the wafer but also information regarding the inside of the wafer, it is determined whether or not the dicing force applied to the wafer to attain the full-cut state is proper. Therefore, for example, when the full-cut state is attained but the internal quality of the wafer decreases, it can be determined that the dicing force is not proper. Accordingly, the quality of the wafer to be processed into the full-cut state can be ensured.

The control unit may identify a meandering width of the crack in a direction intersecting a thickness direction of the wafer inside the wafer in the second process, and determine that the dicing force is out of a proper range and is not proper, when the identified meandering width of the crack is larger than a predetermined value, in the third process. When the dicing force is too large, it is considered that the crack greatly meanders in the direction intersecting the thickness direction of the wafer inside the wafer. A spot where the crack meanders as described above becomes an end surface uneven spot after the wafer is cut. For this reason, when the meandering width of the crack is large, it is determined that the dicing force is too large, and the correction of the dicing force or the like is executed as necessary, so that the occurrence of an uneven spot in the end surface can be suppressed, and the quality of the wafer to be processed into the full-cut state can be appropriately ensured.

In the second process, the control unit may decide a position inside the wafer at which meandering of the crack is assumed to be likely to occur, according to information regarding the wafer, and identify a meandering width of the crack at the decided position. The spot where the meandering of the crack is likely to occur can be predicted to some extent by, for example, a thickness of the wafer or the like. For this reason, the meandering width of the crack at the position inside the wafer at which the meandering of the crack is assumed to be likely to occur is identified in consideration of the information regarding the wafer such as the thickness of the wafer or laser processing conditions such as a laser condensing position, so that a determination related to the meandering width of the crack can be efficiently and appropriately performed.

The control unit may identify a clearness of a mark of the laser beam related to the modified region in the second process, and determine that the dicing force has not reached a proper range and is not proper, when the identified clearness of the mark is higher than a predetermined value, in the third process. When the full-cut state is attained, the mark related to the modified region is vaguely observed and the clearness is low. On the other hand, when the full-cut state is not attained, the mark related to the modified region is distinctly observed and the clearness is high. For this reason, when the clearness of the mark is high, it is determined that the dicing force is small, and correction or the like to increase the dicing force is executed as necessary, so that the full-cut state can be reliably attained, and the quality of the wafer to be processed into the full-cut state can be appropriately ensured.

The control unit may identify a reach state of the crack on the first surface in the second process, and determine that the dicing force has not reached a proper range and is not proper, when the identified reach state of the crack is a stealth state where the crack has not reached the first surface, in the third process. When a half-cut state where the crack has reached the first surface is not attained (the stealth state is attained), naturally, the full-cut state is not attained. For this reason, when the half-cut state is not attained, it is determined that the dicing force is small, and correction or the like to increase the dicing force is executed as necessary, so that the full-cut state can be reliably attained, and the quality of the wafer to be processed into the full-cut state can be appropriately ensured.

The control unit may identify a meandering width of the crack on the first surface in a direction intersecting a thickness direction of the wafer in the second process, and determine that the dicing force is out of a proper range and is not proper, when the identified meandering width of the crack is larger than a predetermined value, in the third process. When the crack on the first surface greatly meanders in the direction intersecting the thickness direction of the wafer, it is considered that the dicing force is too large. For this reason, when the meandering width of the crack on the first surface is larger than the predetermined value, it is determined that the dicing force is large, and correction or the like to reduce the dicing force is executed as necessary, so that the quality of the wafer to be processed into the full-cut state can be appropriately ensured.

The control unit may identify a reach state of the crack on the second surface in the second process, and determine that the dicing force has not reached a proper range and is not proper, when the identified reach state of the crack is a stealth state where the crack has not reached the second surface, in the third process. When a BHC state where the crack has reached the second surface is not attained (the stealth state is attained), naturally, the full-cut state is not attained. For this reason, when the BHC state is not attained, it is determined that the dicing force is small, and correction or the like to increase the dicing force is executed as necessary, so that the full-cut state can be reliably attained, and the quality of the wafer to be processed into the full-cut state can be appropriately ensured.

The control unit may be configured to further execute a fourth process of correcting the processing condition to set the dicing force within a proper range, when it is determined in the third process that the dicing force is not proper, and may execute the first process, the second process, and the third process again according to the processing condition corrected in the fourth process. As described above, since each process is executed again according to the processing condition corrected to set the dicing force within the proper range, it can be determined whether or not the corrected processing condition is proper, and the proper processing condition can be reliably derived.

The control unit may control the irradiation unit to form the plurality of modified regions in the first process, and execute the second process and the third process after the modified region to be formed last in the first process is formed. Accordingly, it can be determined whether or not the dicing force applied to the wafer to attain the full-cut state is proper, based on a state of the wafer after all the modified regions are formed (namely, a state that should be the full-cut state).

An inspection device according to one aspect of the present invention includes: an irradiation unit that irradiates a wafer having a first surface and a second surface with a laser beam from a first surface side of the wafer; an imaging unit that outputs light having a property of transmitting through the wafer, and that detects the light that has propagated through the wafer; and a control unit. The control unit is configured to execute a first process of controlling the irradiation unit according to a processing condition set such that a plurality of modified regions are formed inside the wafer by irradiating the wafer with the laser beam and a full-cut state where cracks extending from the modified regions have reached the first surface and the second surface is attained; a pre-identification process of identifying information related to the modified regions and to the cracks extending from the modified regions, based on a signal output from the imaging unit that has detected the light, before the modified region to be formed last in the first process is formed; and a pre-determination process of determining whether or not a state before the modified region to be formed last is formed is proper, based on the information identified in the pre-identification process. In the full-cut state, it may be difficult to observe a detailed internal state of the wafer. In this respect, since details of the information related to the modified regions and to the cracks (a modified layer position, a crack length, or the like) can be observed (identified) before the modified region to be formed last is formed, a more detailed determination can be performed compared to the determination in the full-cut state. Then, since it is determined whether or not the state before the modified region to be formed last is formed is proper, the quality of the wafer to be processed into the full-cut state can be ensured.

The control unit may be configured to further execute a pre-correction process of correcting the processing condition when it is determined in the pre-determination process that the state before the modified region to be formed last is formed is not proper, and may execute the first process, the pre-identification process, and the pre-determination process again according to the processing condition corrected in the pre-correction process. As described above, the processing condition is corrected when it is determined in the pre-determination process that the state is not proper, so that the quality of the wafer to be processed into the full-cut state can be ensured.

An inspection method according to one aspect of the present invention includes: a first step of irradiating a wafer having a first surface and a second surface with a laser beam from a first surface side according to a processing condition set such that one or a plurality of modified regions are formed inside the wafer and a full-cut state where cracks extending from the modified regions have reached the first surface and the second surface is attained; a second step of outputting light having a property of transmitting through the wafer in which the modified regions are formed by the first step, and of identifying a state of the crack on the first surface extending from the modified region and a state of at least one of the modified regions and the cracks inside the wafer, based on a signal output when the light that has propagated through the wafer is detected; and a third step of determining whether or not a dicing force applied to the wafer according to the processing condition is proper, based on information identified in the second step.

Advantageous Effects of Invention

According to one aspect of the present invention, the quality of the wafer to be processed into the full-cut state can be ensured.

BRIEF DESCRIPTION OF DRAWINGS

FIG. 9 shows SEM images of a modified region and a crack formed inside a semiconductor substrate.

FIG. 11 shows optical path views for describing the imaging principle of the imaging unit for inspection shown in FIG. 5, and schematic views showing images captured at a focus by the imaging unit for inspection.

FIG. 12 shows optical path views for describing the imaging principle of the imaging unit for inspection shown in FIG. 5, and schematic views showing images captured at a focus by the imaging unit for inspection.

FIG. 14 shows views for describing the reason for the necessity of an internal observation when laser processing is performed under a full-cut condition.

FIG. 16 shows views for describing the observation of a width of a crack that meanders.

FIG. 19 is a screen image related to the processing condition derivation process.

FIG. 20 is a screen image related to the processing condition derivation process.

FIG. 21 is a screen image related to the processing condition derivation process.

FIG. 23 is a screen image related to the processing condition derivation process.

FIG. 24 is a screen image related to the processing condition derivation process.

FIG. 27 is a screen image related to the processing condition derivation process according to the modification example.

DESCRIPTION OF EMBODIMENTS

Figure 1:
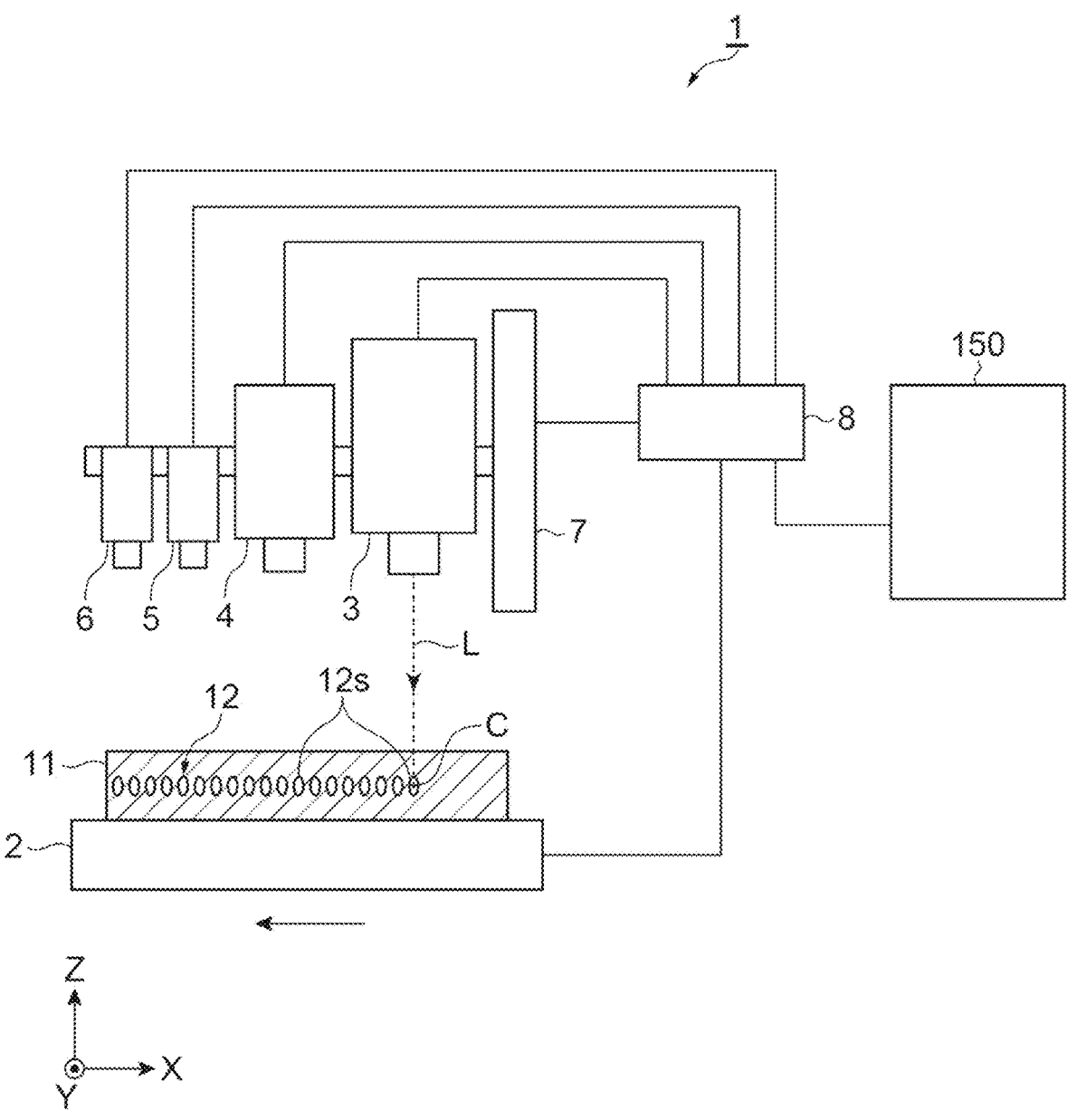
FIG. 1 is a configuration view of an inspection device of one embodiment.

Hereinafter, an embodiment of the present invention will be described in detail with reference to the drawings. Incidentally, in the drawings, the same or corresponding portions will be denoted by the same reference signs, and a duplicated description will not be repeated.

Configuration of Inspection Device

As shown in FIG. 1, an inspection device 1 includes a stage 2, a laser irradiation unit 3 (irradiation unit), a plurality of imaging units 4, 5, and 6, a drive unit 7, a control unit 8, and a display 150 (an input unit and a display unit). The inspection device 1 is a device that irradiates an object 11 with a laser beam L to form a modified region 12 in the object 11.

The stage 2 supports the object 11, for example, by suctioning a film attached to the object 11. The stage 2 is movable in each of an X direction and a Y direction, and is rotatable around an axis parallel to a Z direction as a center line. Incidentally, the X direction and the Y direction are a first horizontal direction and a second horizontal direction perpendicular to each other, and the Z direction is a vertical direction.

The laser irradiation unit 3 condenses the laser beam L having a property of transmitting through the object 11, and irradiates the object 11 with the laser beam L. When the laser beam L is condensed inside the object 11 supported by the stage 2, the laser beam L is absorbed particularly at a portion corresponding to a condensing point C of the laser beam L, and the modified region 12 is formed inside the object 11.

The modified region 12 is a region of which the density, the refractive index, the mechanical strength, and other physical characteristics are different from those of a surrounding non-modified region. Examples of the modified region 12 include a melting region, a crack region, a dielectric breakdown region, a refractive index change region, and the like. The modified region 12 has a characteristic that cracks easily extend from the modified region 12 to an incident side of the laser beam L and to a side opposite the incident side. Such a characteristic of the modified region 12 is used for the cutting of the object 11.

As one example, when the stage 2 is moved along the X direction to move the condensing point C relative to the object 11 along the X direction, a plurality of modified spots 12s are formed to be arranged in one row along the X direction. One modified spot 12s is formed by irradiating the object 11 with the laser beam L of one pulse.

One row of the modified regions 12 are a set of a plurality of the modified spots 12s arranged in one row. The modified spots 12s adjacent to each other may be connected to each other or separated from each other depending on a relative movement speed of the condensing point C with respect to the object 11 and on a repetition frequency of the laser beam L.

The imaging unit 4 captures an image of the modified regions 12 formed in the object 11, and an image of tips of cracks extending from the modified regions 12.

The imaging units 5 and 6 capture images of the object 11 supported by the stage 2, with light transmitting through the object 11 under control of the control unit 8. As one example, the images obtained by the imaging units 5 and 6 are used for the alignment of an irradiation position of the laser beam L.

The drive unit 7 supports the laser irradiation unit 3 and the plurality of imaging units 4, 5, and 6. The drive unit 7 moves the laser irradiation unit 3 and the plurality of imaging units 4, 5, and 6 along the Z direction.

The control unit 8 controls operations of the stage 2, the laser irradiation unit 3, the plurality of imaging units 4, 5, and 6, and the drive unit 7. The control unit 8 is configured as a computer device including a processor, a memory, a storage, a communication device, and the like. In the control unit 8, the processor executes software (program) read into the memory or the like, and controls the reading and writing of data from and to the memory and the storage and communication by the communication device.

The display 150 has a function as an input unit that receives an input of information from a user, and a function as a display unit that displays information for the user.

Configuration of Object

Figure 2:
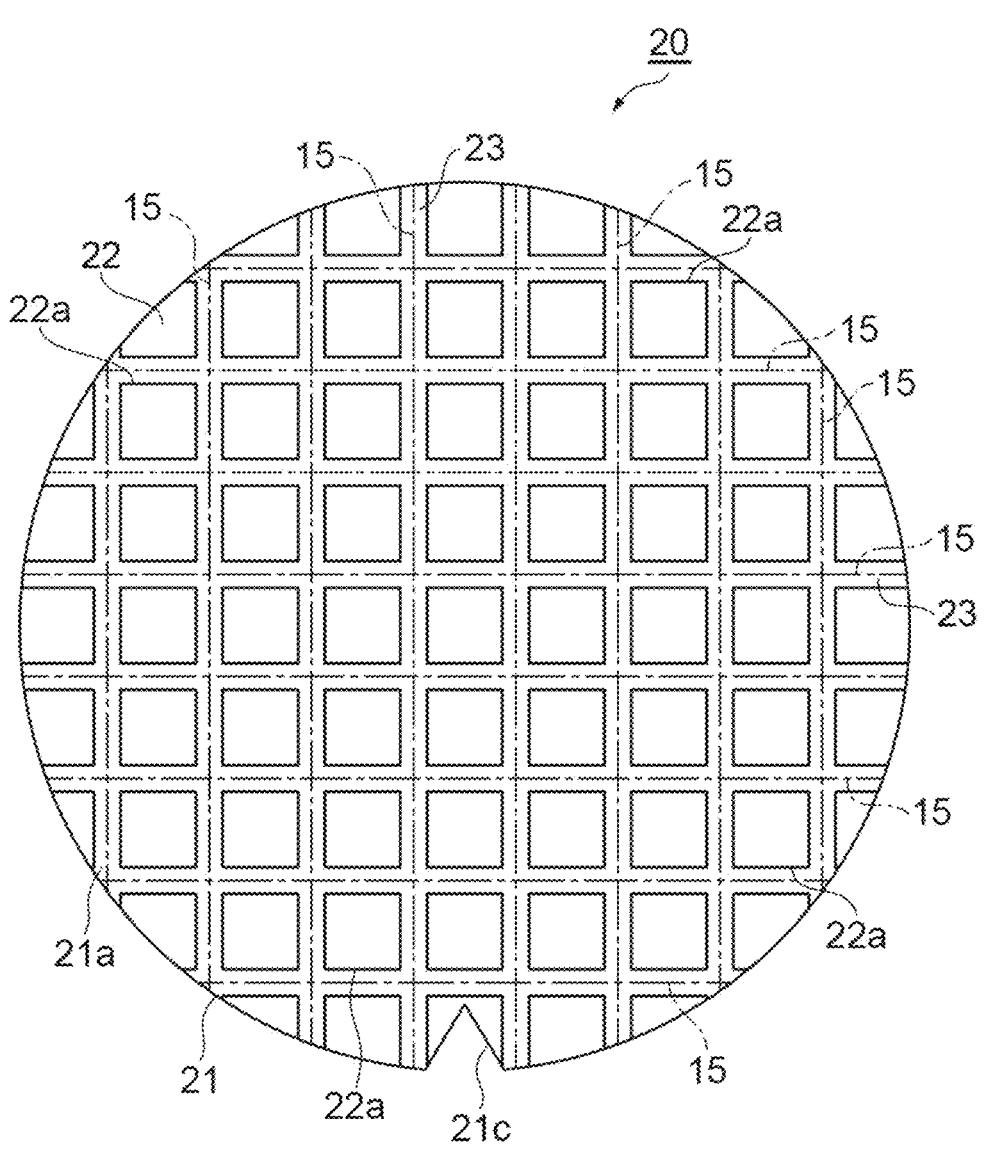
FIG. 2 is a plan view of a wafer of one embodiment.
Figure 3:
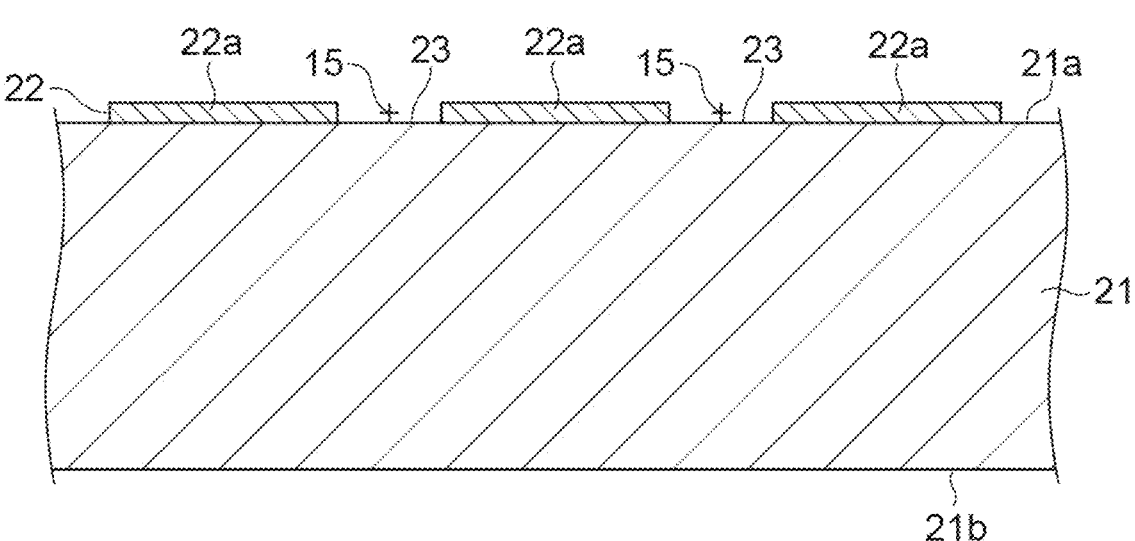
FIG. 3 is a cross-sectional view of a portion of the wafer shown in FIG. 2.

The object 11 of the present embodiment is a wafer 20 as shown in FIGS. 2 and 3. The wafer 20 includes a semiconductor substrate 21 and a functional element layer 22. Incidentally, in the present embodiment, the wafer 20 will be described as including the functional element layer 22, but the wafer 20 may or may not include the functional element layer 22 and may be a bare wafer. The semiconductor substrate 21 includes a surface 21a (second surface) and a back surface 21b (first surface). The semiconductor substrate 21 is, for example, a silicon substrate. The functional element layer 22 is formed on the surface 21a of the semiconductor substrate 21. The functional element layer 22 includes a plurality of functional elements 22a that are two-dimensionally arranged along the surface 21a. The functional element 22a is, for example, a light-receiving element such as a photodiode, a light-emitting element such as a laser diode, a circuit element such as a memory, or the like. The functional element 22a may be three-dimensionally configured such that a plurality of layers are stacked. Incidentally, the semiconductor substrate 21 is provided with a notch 21c indicating a crystal orientation, but an orientation flat may be provided instead of the notch 21c.

The wafer 20 is cut for each functional element 22a along each of a plurality of lines 15. The plurality of lines 15 pass between the plurality of respective functional elements 22a when viewed in a thickness direction of the wafer 20. More specifically, each of the lines 15 passes through a center of a street region 23 (center in a width direction) when viewed in the thickness direction of the wafer 20. The street region 23 extends to pass between the functional elements 22a adjacent to each other in the functional element layer 22. In the present embodiment, the plurality of functional elements 22a are arranged in a matrix pattern along the surface 21a, and the plurality of lines 15 are set in a grid pattern. Incidentally, the lines 15 are imaginary lines but may be lines that are actually drawn.

Configuration of Laser Irradiation Unit

Figure 4:
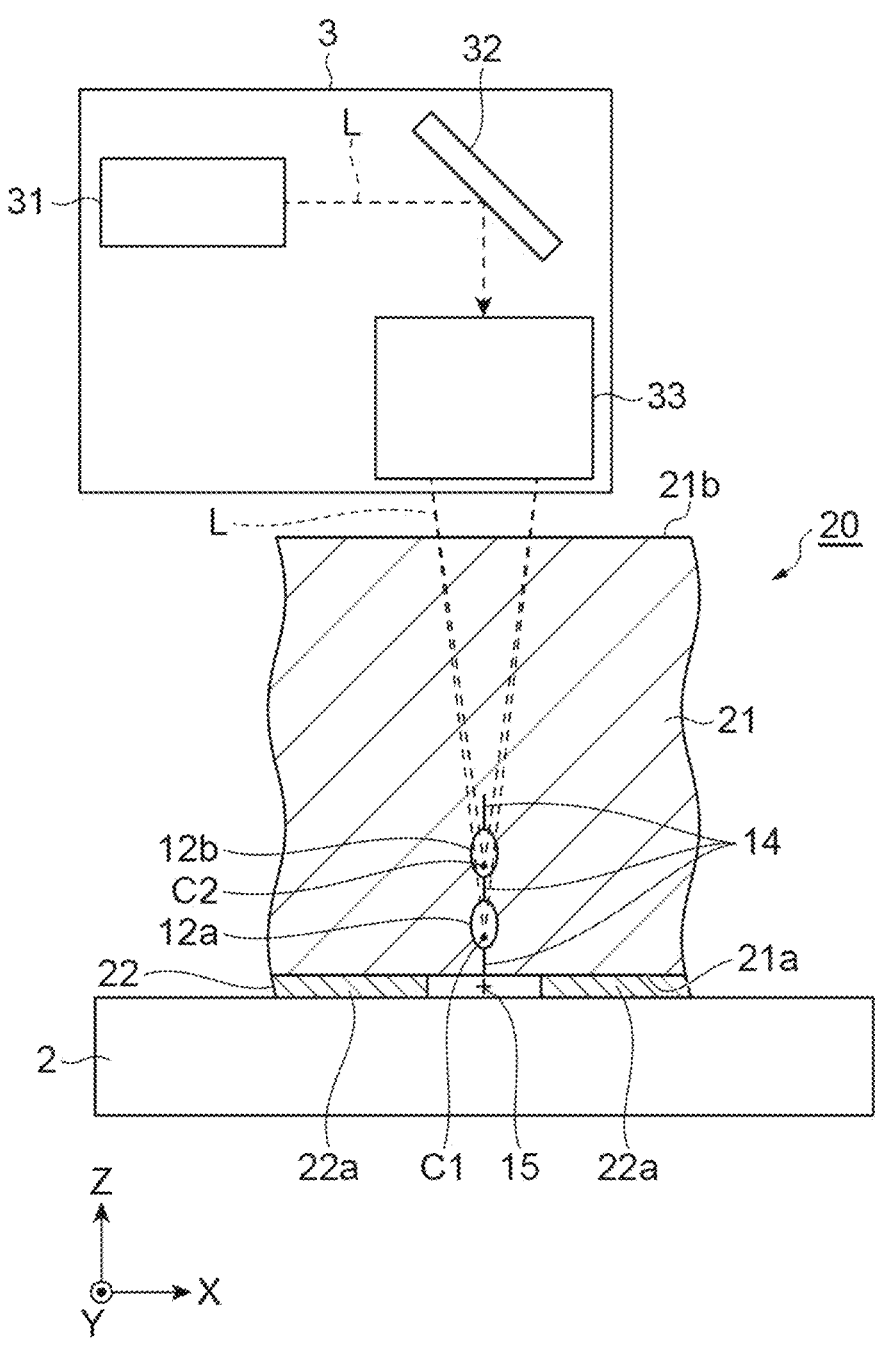
FIG. 4 is a configuration view of a laser irradiation unit shown in FIG. 1.

As shown in FIG. 4, the laser irradiation unit 3 includes a light source 31, a spatial light modulator 32, and a condenser lens 33. The light source 31 outputs the laser beam L according to, for example, a pulse oscillation method. The spatial light modulator 32 modulates the laser beam L output from the light source 31. The spatial light modulator 32 is, for example, a liquid crystal on silicon (LCOS) spatial light modulator (SLM). The condenser lens 33 condenses the laser beam L modulated by the spatial light modulator 32. Incidentally, the condenser lens 33 may be a correction ring lens.

In the present embodiment, the laser irradiation unit 3 irradiates the wafer 20 with the laser beam L from a back surface 21b side of the semiconductor substrate 21 along each of the plurality of lines 15 to form two rows of modified regions 12a and 12b inside the semiconductor substrate 21 along each of the plurality of lines 15. Of the two rows of modified regions 12a and 12b, the modified region 12a is a modified region closest to the surface 21a. Of the two rows of modified regions 12a and 12b, the modified region 12b is a modified region closest to the modified region 12a, and is a modified region closest to the back surface 21b.

The two rows of modified regions 12a and 12b are adjacent to each other in the thickness direction (Z direction) of the wafer 20. The two rows of modified regions 12a and 12b are formed by moving two condensing points C1 and C2 relative to the semiconductor substrate 21 along the line 15. For example, the laser beam L is modulated by the spatial light modulator 32 such that the condensing point C2 is located behind the condensing point C1 in a traveling direction and on the incident side of the laser beam L. Incidentally, regarding the formation of the modified regions, a single focus or a multi-focus may be used, and a single pass or a plurality of passes may be used.

The laser irradiation unit 3 irradiates the wafer 20 with the laser beam L from the back surface 21b side of the semiconductor substrate 21 along each of the plurality of lines 15. As one example, the two condensing points C1 and C2 are aligned with a position of 54 μm and with a position of 128 μm from the surface 21a in the semiconductor substrate 21 that is a single-crystal silicon <100> substrate having a thickness of 400 µm, respectively, and the wafer 20 is irradiated with the laser beam L from the back surface 21b side of the semiconductor substrate 21 along each of the plurality of lines 15. In this case, for example, in order to satisfy a condition where a crack 14 across the two rows of modified regions 12a and 12b reaches the surface 21a of the semiconductor substrate 21, the laser beam L is set to have a wavelength of 1099 nm, a pulse width of 700 nsec, and a repetition frequency of 120 kHz. In addition, an output of the laser beam L at the condensing point C1 is set to 2.7 W, an output of the laser beam L at the condensing point C2 is set to 2.7 W, and a relative movement speed of the two condensing points C1 and C2 with respect to the semiconductor substrate 21 is set to 800 mm/sec. Incidentally, for example, when the number of processing passes is set to 5, for example, ZH80 (a position of 328 µm from the surface 21a), ZH69 (a position of 283 µm from the surface 21a), ZH57 (a position of 234 µm from the surface 21a), ZH26 (a position of 107 µm from the surface 21a), and ZH12 (a position of 49.2 µm from the surface 21a) may be set as processing positions in the wafer 20 described above. In this case, for example, the laser beam L may have a wavelength of 1080 nm, a pulse width of 400 nsec, and a repetition frequency of 100 kHz, and the movement speed of the condensing points C1 and C2 may be 490 mm/sec.

Such formation of the two rows of modified regions 12a and 12b and of the crack 14 is executed in the following case. Namely, such a case is, for example, a case where, in a post-step, the back surface 21b of the semiconductor substrate 21 is ground to thin the semiconductor substrate 21 and to expose the crack 14 on the back surface 21b, and the wafer 20 is cut into a plurality of semiconductor devices along each of the plurality of lines 15.

Configuration of Imaging Unit for Inspection

Figure 5:
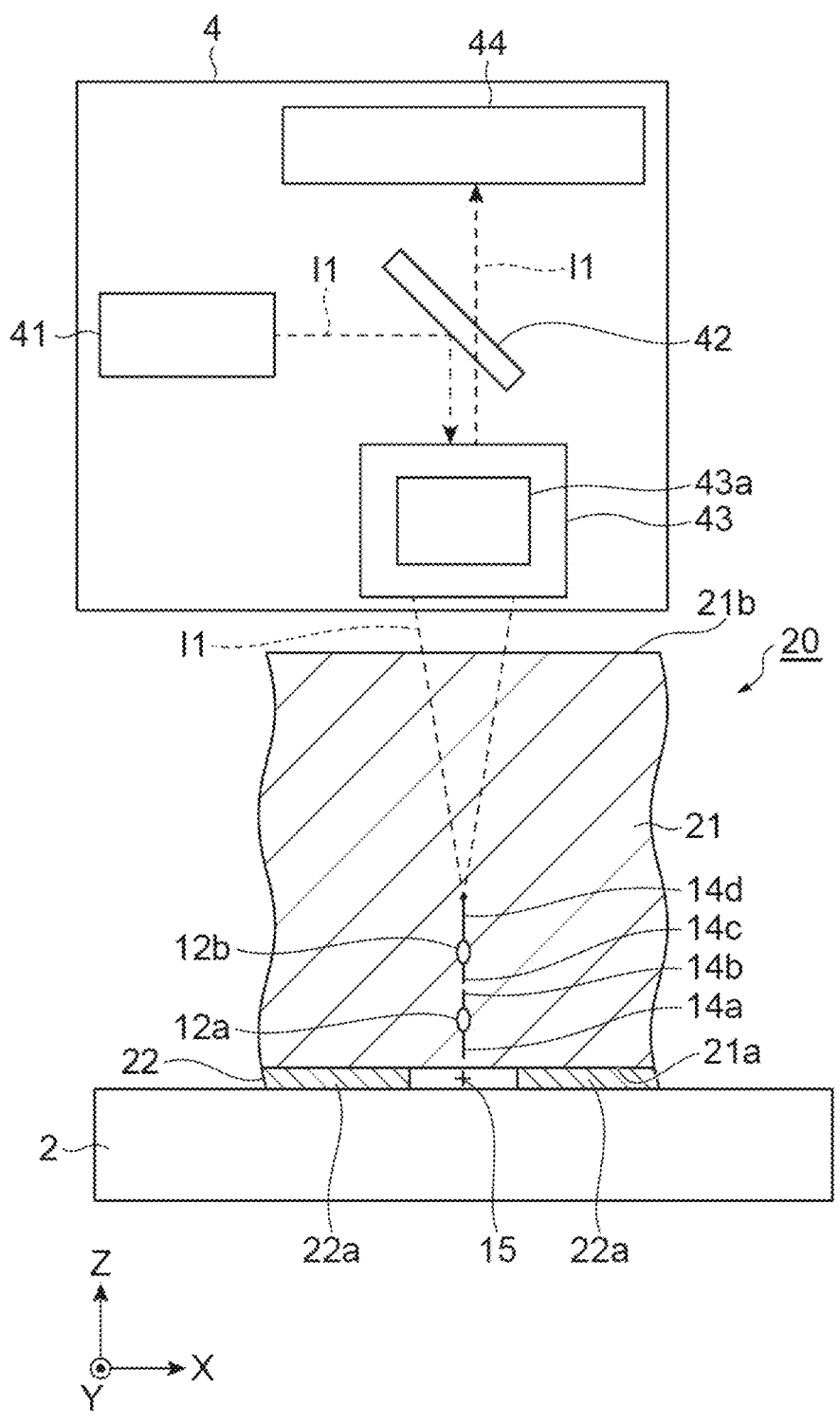
FIG. 5 is a configuration view of an imaging unit for inspection shown in FIG. 1.

As shown in FIG. 5, the imaging unit 4 (imaging unit) includes a light source 41, a mirror 42, an objective lens 43, and a light detection unit 44. The imaging unit 4 captures an image of the wafer 20. The light source 41 outputs light I1 having a property of transmitting through the semiconductor substrate 21. The light source 41 includes, for example, a halogen lamp and a filter, and outputs the light I1 in a near-infrared region. The light I1 output from the light source 41 is reflected by the mirror 42, passes through the objective lens 43, and is applied to the wafer 20 from the back surface 21b side of the semiconductor substrate 21. At this time, the stage 2 supports the wafer 20 in which the two rows of modified regions 12a and 12b are formed as described above.

The objective lens 43 passes the light I1 reflected by the surface 21a of the semiconductor substrate 21. Namely, the objective lens 43 passes the light I1 that has propagated through the semiconductor substrate 21. A numerical aperture (NA) of the objective lens 43 is, for example, 0.45 or more. The objective lens 43 includes a correction ring 43a. For example, the correction ring 43a adjusts a distance between a plurality of lenses forming the objective lens 43, to correct an aberration generated in the light I1 inside the semiconductor substrate 21. Incidentally, means for correcting an aberration is not limited to the correction ring 43a, and may be other correction means such as a spatial light modulator. The light detection unit 44 detects the light I1 that has transmitted through the objective lens 43 and through the mirror 42. The light detection unit 44 is configured as, for example, an InGaAs camera, and detects the light I1 in the near-infrared region. Incidentally, means for detecting (capturing an image) the light I1 in the near-infrared region is not limited to the InGaAs camera, and may be other imaging means such as a transmission confocal microscope as long as the other imaging means can capture a transmissive image.

The imaging unit 4 can capture an image of each of the two rows of modified regions 12a and 12b and of a tip of each of a plurality of cracks 14a, 14b, 14c, and 14d (details will be described later). The crack 14a is a crack extending from the modified region 12a toward a surface 21a side. The crack 14b is a crack extending from the modified region 12a toward the back surface 21b side. The crack 14c is a crack extending from the modified region 12b toward the surface 21a side. The crack 14d is a crack extending from the modified region 12b toward the back surface 21b side.

Configuration of Imaging Unit for Alignment Correction

Figure 6:
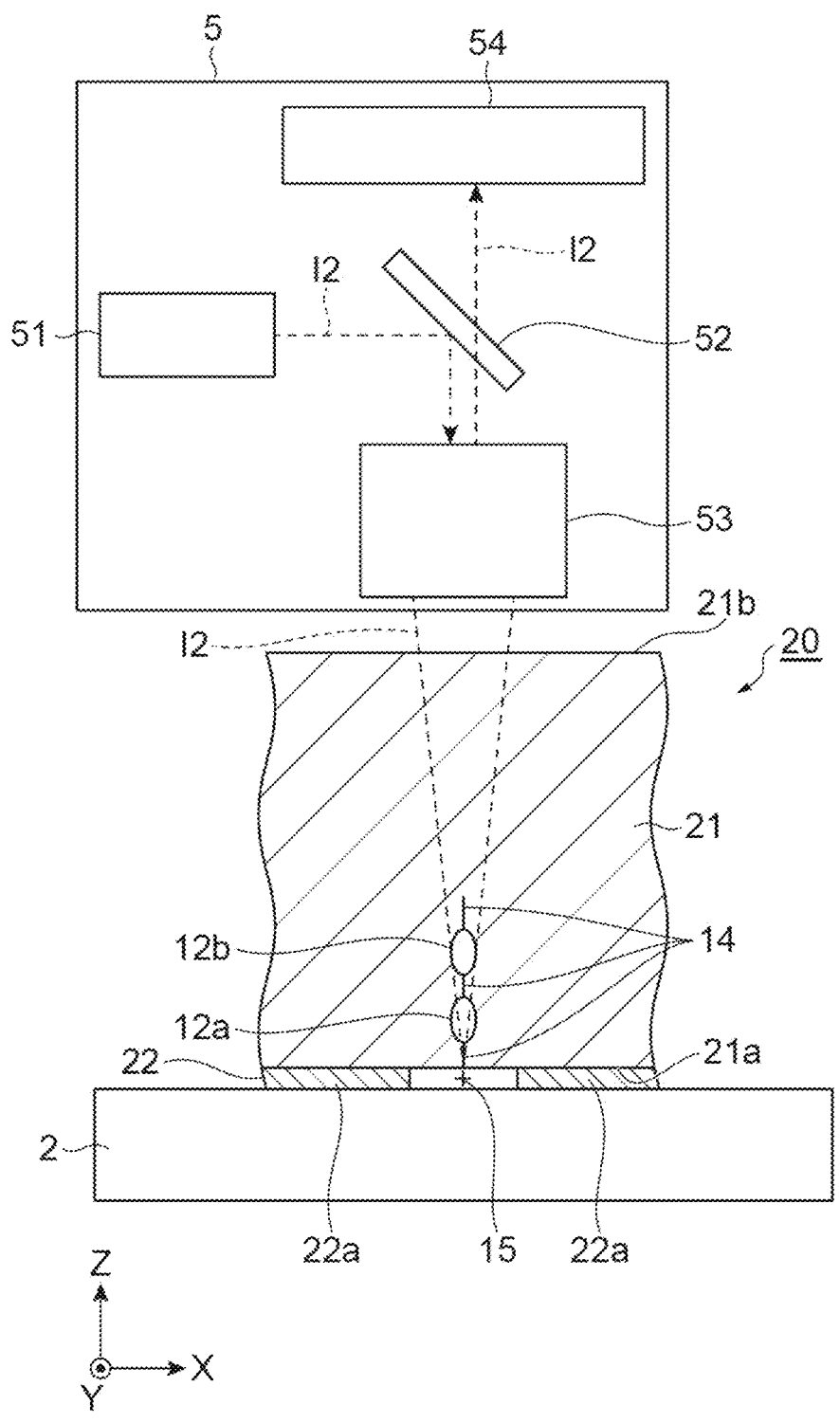
FIG. 6 is a configuration view of an imaging unit for alignment correction shown in FIG. 1.

As shown in FIG. 6, the imaging unit 5 includes a light source 51, a mirror 52, a lens 53, and a light detection unit 54. The light source 51 outputs light 12 having a property of transmitting through the semiconductor substrate 21. The light source 51 includes, for example, a halogen lamp and a filter, and outputs the light 12 in the near-infrared region. The light source 51 and the light source 41 of the imaging unit 4 may be common to each other. The light 12 output from the light source 51 is reflected by the mirror 52, passes through the lens 53, and is applied to the wafer 20 from the back surface 21b side of the semiconductor substrate 21.

The lens 53 passes the light 12 reflected by the surface 21a of the semiconductor substrate 21. Namely, the lens 53 passes the light 12 that has propagated through the semiconductor substrate 21. A numerical aperture of the lens 53 is 0.3 or less. Namely, the numerical aperture of the objective lens 43 of the imaging unit 4 is larger than the numerical aperture of the lens 53. The light detection unit 54 detects the light 12 that has passed through the lens 53 and through the mirror 52. The light detection unit 54 is configured as, for example, an InGaAs camera and detects the light 12 in the near-infrared region.

Under control of the control unit 8, the imaging unit 5 irradiates the wafer 20 with the light 12 from the back surface 21b side and detects the light 12 returning from the surface 21a (functional element layer 22), to capture an image of the functional element layer 22. In addition, similarly, under control of the control unit 8, the imaging unit 5 irradiates the wafer 20 with the light 12 from the back surface 21b side and detects the light 12 returning from formation positions of the modified regions 12a and 12b in the semiconductor substrate 21, to acquire images of regions including the modified regions 12a and 12b. These images are used for the alignment of the irradiation position of the laser beam L. The imaging unit 6 has the same configuration as that of the imaging unit 5 except that the lens 53 has a lower magnification (for example, the lens 53 of the imaging unit 5 has a magnification of 6, and a lens of the imaging unit 6 has a magnification of 1.5), and is used for alignment similarly to the imaging unit 5.

Imaging Principle of Imaging Unit for Inspection

Figure 7:
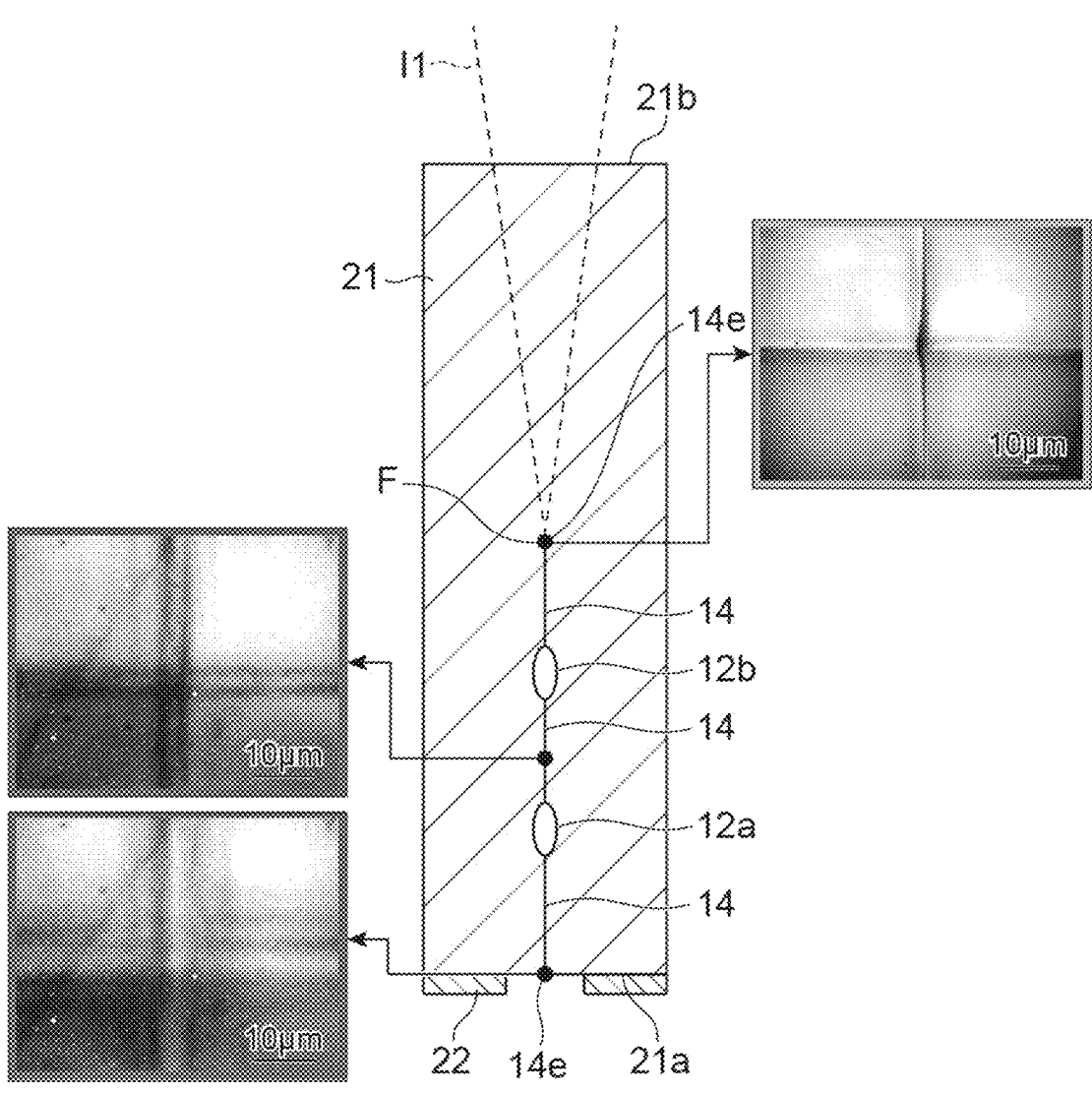
FIG. 7 is a cross-sectional view of a wafer for describing an imaging principle of the imaging unit for inspection shown in FIG. 5, and shows images captured at each spot by the imaging unit for inspection.

As shown in FIG. 7, the imaging unit 4 shown in FIG. 5 is used to move a focus F (a focus of the objective lens 43) from the back surface 21b side toward the surface 21a side in the semiconductor substrate 21 in which the crack 14 across the two rows of modified regions 12a and 12b reaches the surface 21*a*. In this case, when the focus F is aligned with a tip 14*e* of the crack 14 from the back surface 21*b* side, the crack 14 extending from the modified region 12*b* toward the back surface 21*b* side, the tip 14*e* can be checked (a right image in FIG. 7). However, even when the focus F is aligned with the crack 14 itself and with the tip 14*e* of the crack 14 reaching the surface 21*a*, from the back surface 21*b* side, the crack 14 and the tip 14*e* of the crack 14 cannot be checked (left images in FIG. 7). Incidentally, when the focus F is aligned with the surface 21*a* of the semiconductor substrate 21 from the back surface 21*b* side, the functional element layer 22 can be checked.

Figure 8:
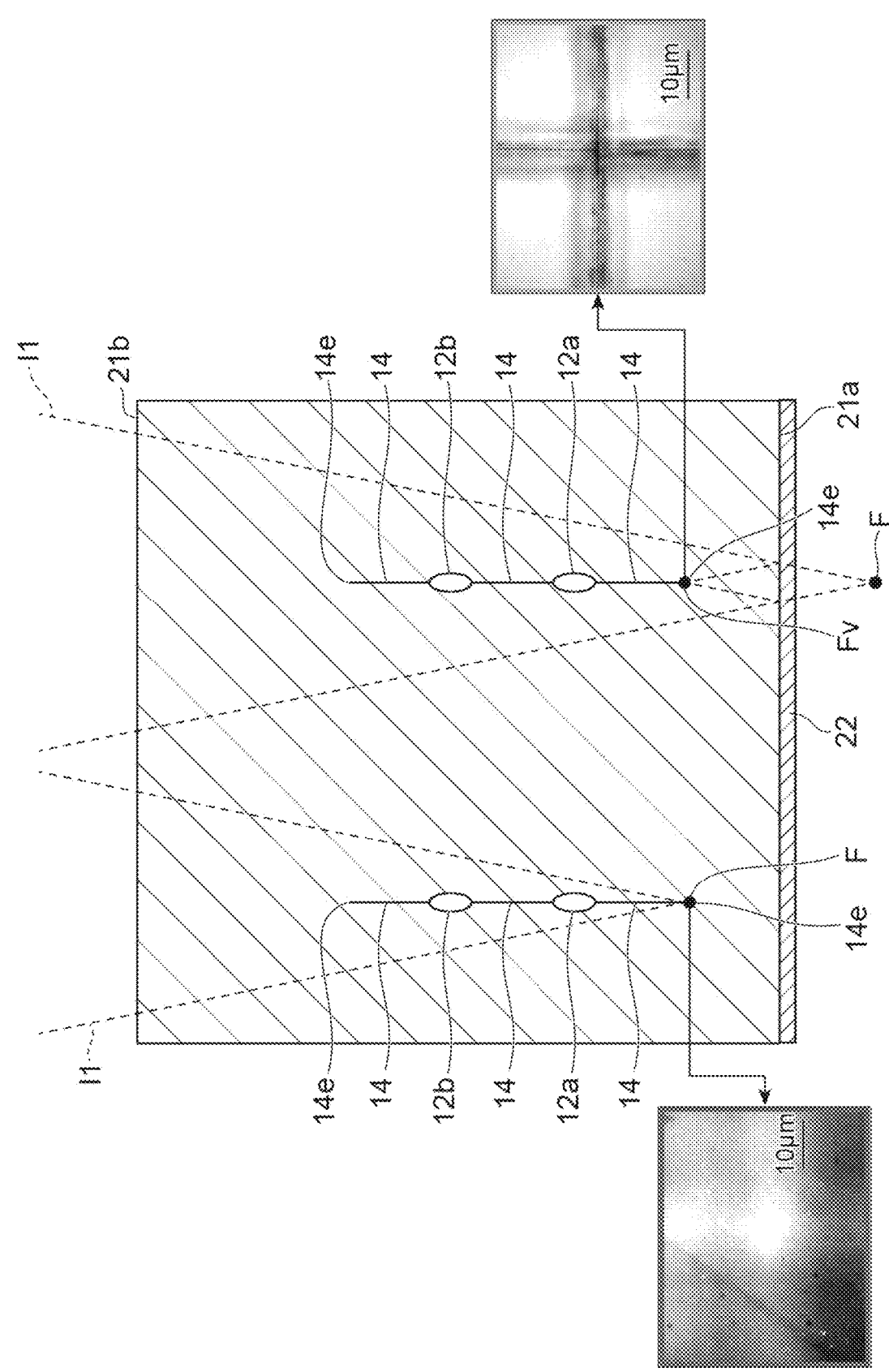
FIG. 8 is a cross-sectional view of a wafer for describing the imaging principle of the imaging unit for inspection shown in FIG. 5, and shows images captured at each spot by the imaging unit for inspection.

In addition, as shown in FIG. 8, the imaging unit 4 shown in FIG. 5 is used to move the focus F from the back surface 21*b* side toward the surface 21*a* side in the semiconductor substrate 21 in which the crack 14 across the two rows of modified regions 12*a* and 12*b* does not reach the surface 21*a*. In this case, even when the focus F is aligned with the tip 14*e* of the crack 14 extending from the modified region 12*a* toward the surface 21*a* side, from the back surface 21*b* side, the tip 14*e* cannot be checked (a left image in FIG. 8). However, when the focus F is aligned with a region opposite the back surface 21*b* with respect to the surface 21*a* (namely, a region on a functional element layer 22 side with respect to the surface 21*a*), from the back surface 21*b* side, and an imaginary focus Fv that is symmetric to the focus F with respect to the surface 21*a* is located at the tip 14*e*, the tip 14*e* can be checked (a right image in FIG. 8). Incidentally, the imaginary focus Fv is a point that is symmetric to the focus F with respect to the surface 21*a* and that is set in consideration of a refractive index of the semiconductor substrate 21.

Figure 10:
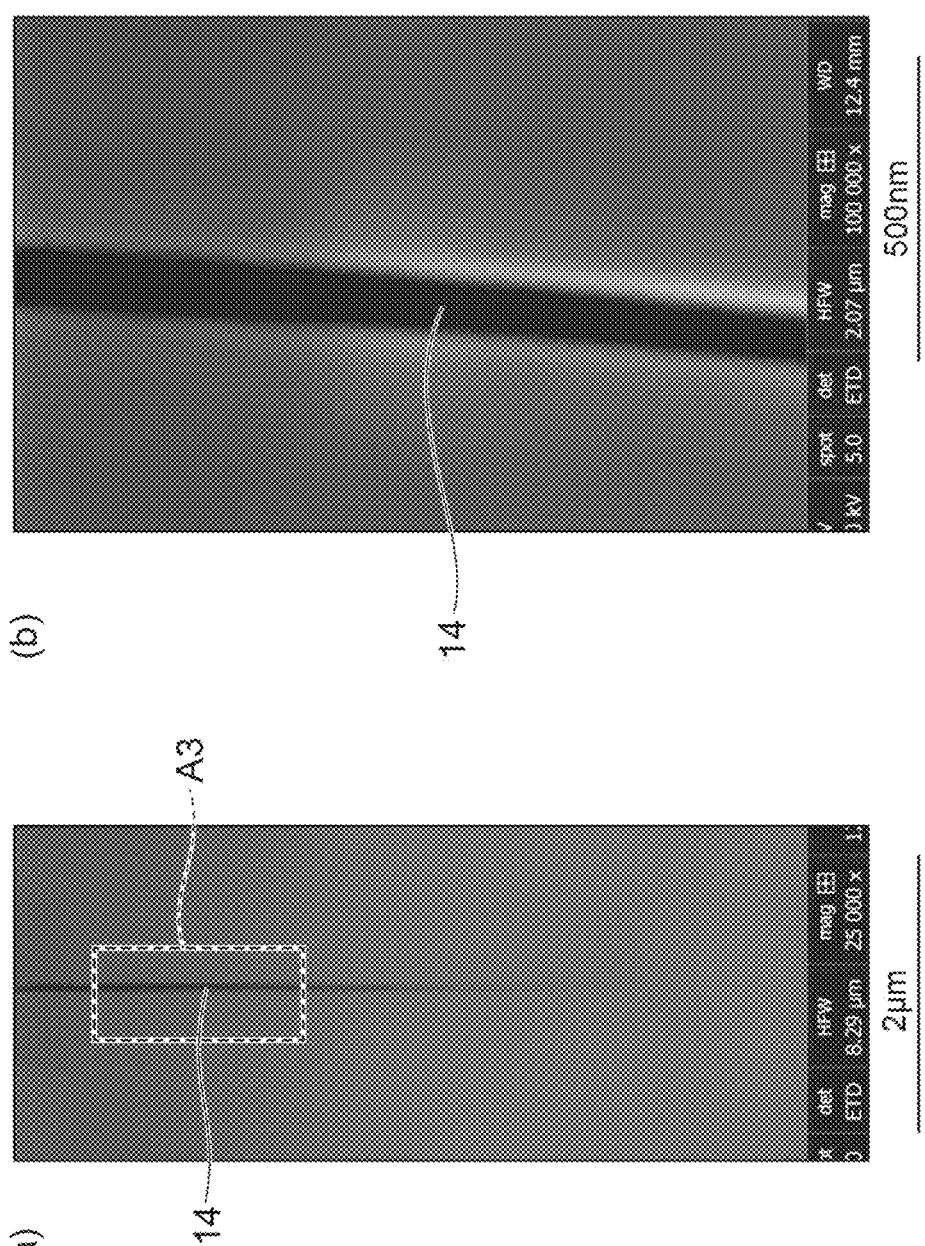
FIG. 10 shows SEM images of the modified region and the crack formed inside a semiconductor substrate.

It is assumed that the reason the crack 14 itself cannot be checked as described above is that a width of the crack 14 is smaller than a wavelength of the light I1 that is illumination light. FIGS. 9 and 10 show scanning electron microscope (SEM) images of the modified region 12 and of the crack 14 formed inside the semiconductor substrate 21 that is a silicon substrate. FIG. 9(*b*) is an enlarged image of a region A1 shown in FIG. 9(*a*), FIG. 10(*a*) is an enlarged image of a region A2 shown in FIG. 9(*b*), and FIG. 10(*b*) is an enlarged image of a region A3 shown in FIG. 10(*a*). As described above, the width of the crack 14 is approximately 120 nm, and is smaller than the wavelength (for example, 1.1 to 1.2 μm) of the light I1 in the near-infrared region.

An imaging principle assumed based on the above is as follows. As shown in FIG. 11(*a*), when the focus F is located in the air, the light I1 does not return, so that a blackish image is obtained (a right image in FIG. 11(*a*)). As shown in FIG. 11(*b*), when the focus F is located inside the semiconductor substrate 21, the light I1 reflected by the surface 21*a* returns, so that a whitish image is obtained (a right image in FIG. 11(*b*)). As shown in FIG. 11(*c*), when the focus F is aligned with the modified region 12 from the back surface 21*b* side, the absorption, the scattering, or the like of some of the light I1 that is reflected by the surface 21*a* to return is caused by the modified region 12, so that an image is obtained in which the modified region 12 appears blackish in the whitish background (a right image in FIG. 11(*c*)).

As shown in FIGS. 12(*a*) and 12(*b*), when the focus F is aligned with the tip 14*e* of the crack 14 from the back surface 21*b* side, the scattering, the reflection, the interference, the absorption, or the like of some of the light I1 that is reflected by the surface 21*a* to return is caused, for example, by optical singularities (stress concentration, strain, a discontinuity of atomic density, and the like) occurring in the vicinity of the tip 14*e*, and by light confinement occurring in the vicinity of the tip 14*e*, so that images are obtained in which the tip 14*e* appears blackish in the whitish background (right images in FIGS. 12(*a*) and 12(*b*)). As shown in FIG. 12(*c*), when the focus F is aligned with a portion other than the vicinity of the tip 14*e* of the crack 14 from the back surface 21*b* side, at least some of the light I1 reflected by the surface 21*a* returns, so that a whitish image is obtained (a right image in FIG. 12(*c*)).

Processing Condition Derivation Process

Hereinafter, a dicing force determination process in a processing condition derivation process will be described, which is to be executed as a pre-process of a process of forming modified regions for the purpose of cutting the wafer 20 or the like. Incidentally, hereinafter, the dicing force determination process in the processing condition derivation process will be described as one example, but the dicing force determination process may be executed in processes other than the processing condition derivation process, for example, in various inspection processes to be executed after a processing condition is derived. The processing condition is a recipe related to processing that indicates in which conditions and procedures the wafer 20 is processed.

Figure 13:
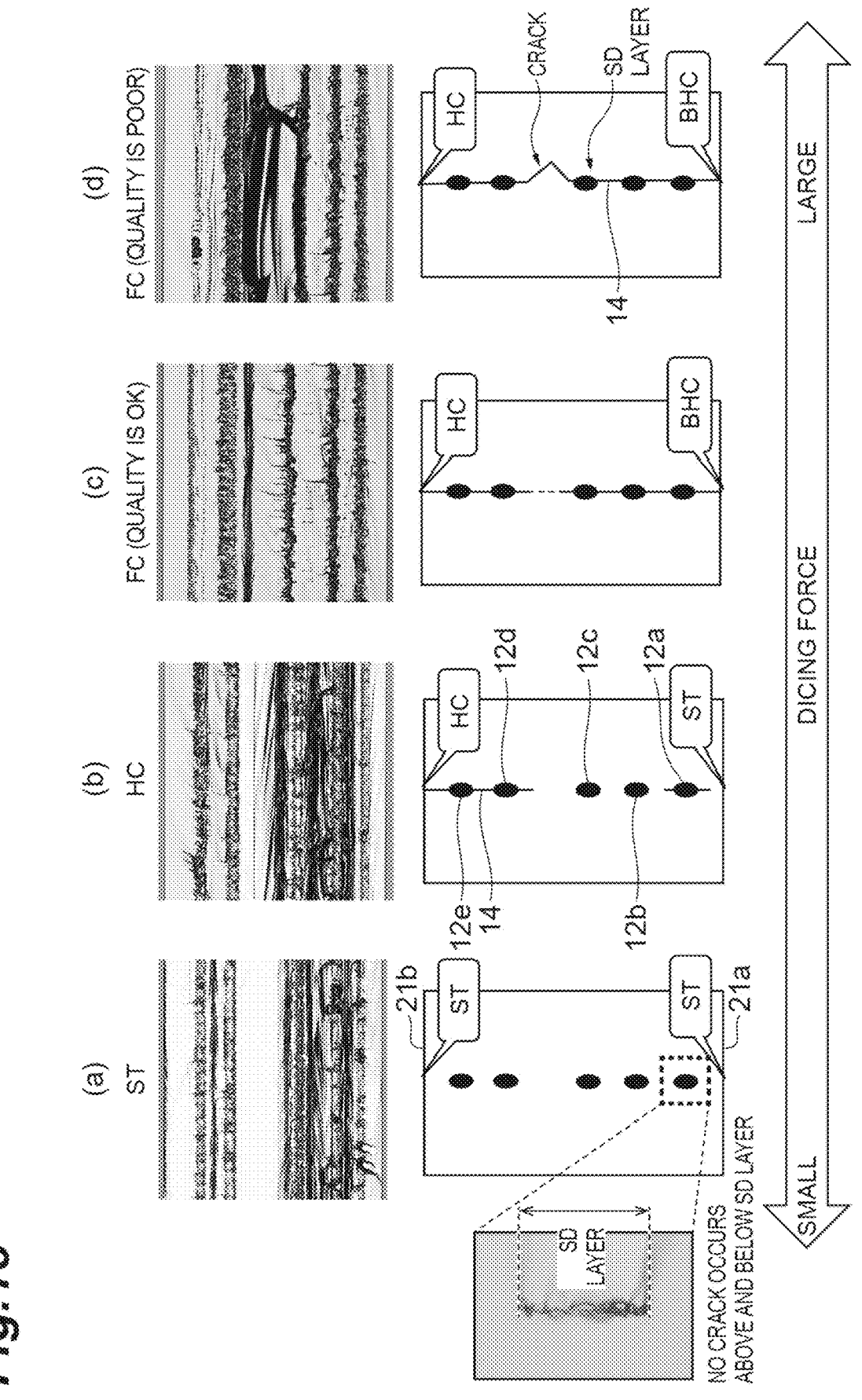
FIG. 13 shows views for describing states of wafers according to a dicing force applied to the wafers.

A dicing force is a force related to the dicing (cutting) of the wafer 20 that is applied to the wafer 20 when the wafer 20 is irradiated with the laser beam. FIG. 13 shows views for illustrating states of the wafers 20 according to a dicing force applied to the wafers 20. In FIGS. 13(*a*) to 13(*d*), upper views are views showing actual states (observed states) of cross-sections of the wafers 20, and lower views are views schematically showing the cross-sections shown in the upper views. As shown in the lower views of FIGS. 13(*a*) to 13(*d*), five rows of modified regions 12*a* to 12*e* are formed in each of the wafers 20 from a side close to the surface 21*a*, the side being opposite an incident surface of the laser beam. In the examples shown in FIG. 13, the dicing force applied to the wafers 20 decreases in order of FIG. 13(*d*), FIG. 13(*c*), FIG. 13(*b*), and FIG. 13(*a*). In the state of FIG. 13(*a*) where the dicing force is the smallest, the crack 14 does not occur above and below the modified regions (SD layers), and a stealth (ST) state where the crack 14 has not reached both the back surface 21*b* and the surface 21*a* is attained. In the state of FIG. 13(*b*), the cracks 14 occur above and below at least modified regions 12*a*, 12*d*, and 12*e*, and a half-cut (HC) state where the crack 14 has reached the back surface 21*b* is attained. In FIG. 13(*b*), the crack 14 has not reached the surface 21*a* (ST state). In the state of FIG. 13(*c*), the cracks 14 occur above and below all the modified regions 12*a* to 12*e*, the HC state where the crack 14 has reached the back surface 21*b* is attained, and a bottom side half-cut (BHC) state where the crack 14 has reached the surface 21*a* is attained. As described above, the state of FIG. 13(*c*) is a full-cut state where the cracks 14 have reached the back surface 21*b* and the surface 21*a*. Incidentally, a state where, even when there are very few spots inside the wafer 20 where the cracks 14 are not connected to each other, the spots where the cracks 14 are connected to each other are at a level at which the wafer 20 can be diced by a standard expand tape (for example, an expand tape having an expansion distance of 15 mm and an expansion rate of 5 mm/sec) is regarded as the full-cut state. The very few spots where the cracks 14 are not connected to each other are a resolidified spot (spot that is resolidified after being melt when laser irradiation is performed) in a modified layer portion, a black streak spot where the cracks 14 are not intentionally connected to each other to improve chip quality, and the like.

Similarly, even in the state of FIG. 13(*d*) where the dicing force is the largest, the full-cut state where the cracks 14 have reached the back surface 21*b* and the surface 21*a* is attained. Here, as shown in the lower view of FIG. 13(*d*), since the dicing force is too large, in the example of FIG. 13(*d*), the crack 14 meanders in a direction intersecting the thickness direction (Z direction) of the wafer 20. When the dicing force is too large as described above, it is considered that the crack 14 greatly meanders in the direction intersecting the Z direction inside the wafer 20. A spot where the crack 14 meanders becomes an end surface uneven spot after the wafer 20 is cut. As described above, for example, even when laser processing is performed for the purpose of attaining the full-cut state and the full-cut state is attained, the internal quality of the wafer 20 may decrease depending on the dicing force. In the present embodiment, an internal observation of the wafer 20 is performed to determine whether or not the dicing force is within a proper range, and when the dicing force is not within the proper range, a recipe (processing condition) correction process is executed such that the dicing force is within the proper range. An appropriate recipe (processing condition) taking the dicing force into consideration can be derived by executing the dicing force determination process and the correction process as described above.

The reason for the necessity of an internal observation of the wafer 20 will be further described with reference to FIG. 14. As described above, when laser processing is performed for the purpose of attaining the full-cut state, even though it is confirmed that the crack 14 has reached the back surface 21*b* that is a laser incident surface, if a crack state inside the wafer 20 is poor, the device quality is NG. For example, the occurrence of the above-described end surface uneven spot is considered as an example of a poor crack state. Since it is considered that a defect such as an incorrect chip size, a reduction in chip transverse strength, or particle dust generation is caused by the occurrence of end surface unevenness, the device quality is NG. In the cross-section example shown in FIG. 14(*a*), since the crack 14 occurring inside the wafer 20 stops on the way toward the back surface 21*b*, the crack 14 in the vicinity of the back surface 21*b* extends straight, but the crack 14 at a central portion of the wafer 20 in the Z direction is formed to be bent (meander). As described above, depending on the method, a crack state in the vicinity of the back surface 21*b* can be normalized by stopping the extension of the crack 14, but a crack state inside the wafer 20 may become poor. In consideration of such a case, it is necessary to perform internal observation of the wafer 20. In addition, as shown in a schematic view of the cross-section shown in FIG. 14(*b*), when the incident surface quality is of particular concern, a reversed SD method may be adopted in which first, a modified region (SD1) closest to the back surface 21*b* that is an incident surface is formed, and then other modified regions (SD2 to SD4) are formed. Even in this case, the crack state of the back surface 21*b* is normal, but for example, as shown in FIG. 14(*b*), there is a possibility of the occurrence of a problem such as the crack 14 discontinuing inside the wafer 20. In consideration of such a case, it is necessary to perform internal observation of the wafer 20.

Figure 15:
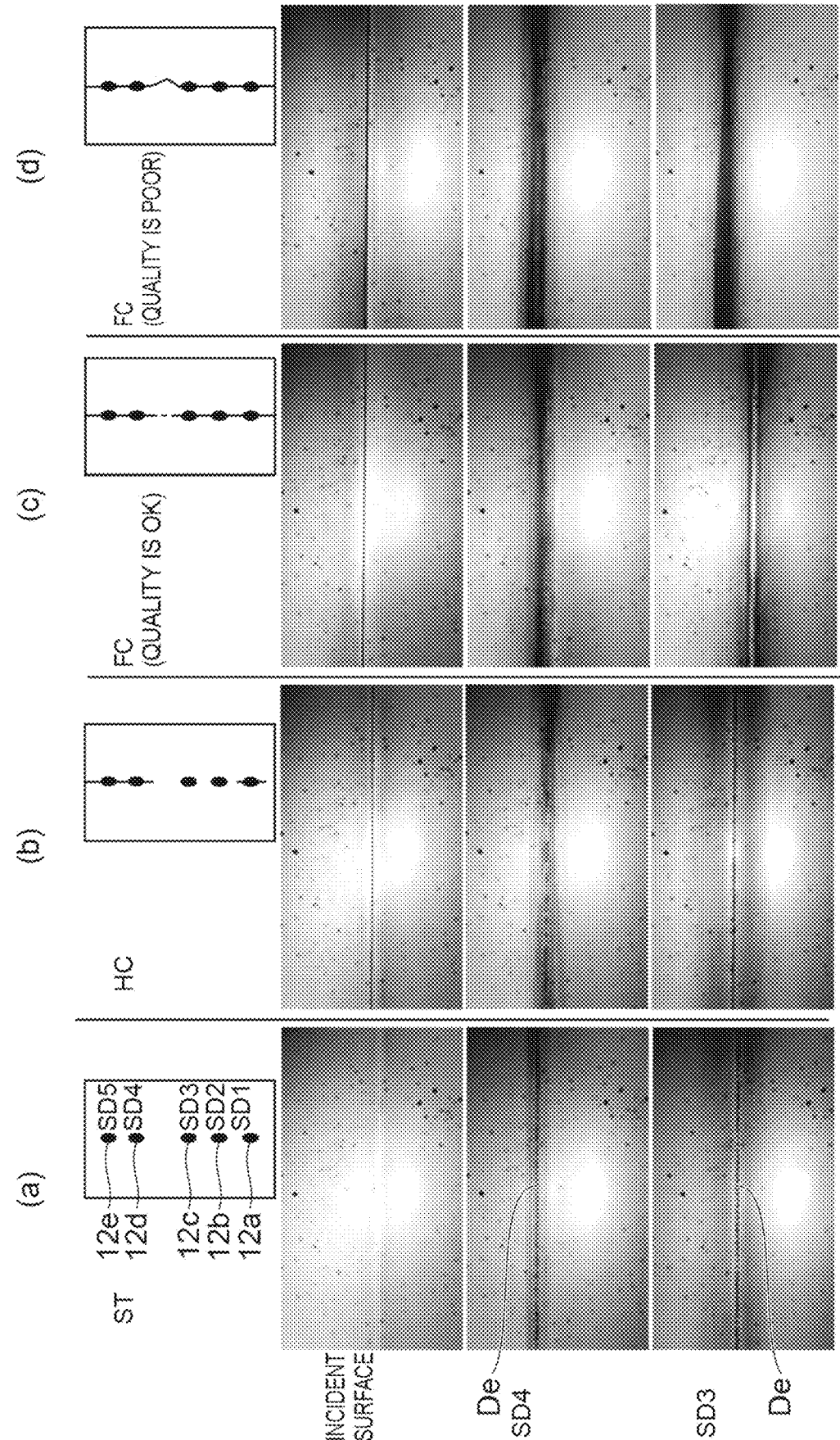
FIG. 15 shows views schematically showing observation results of each state of wafers.

FIG. 15 shows views schematically showing internal observation results of each state of wafers 20. FIGS. 15(*a*) to 15(*d*) show internal observation results corresponding to the states of FIGS. 13(*a*) to 13(*d*), respectively. Namely, FIG. 15(*a*) shows internal observation results in the ST state where the cracks 14 have not reached both the back surface 21*b* and the surface 21*a*, FIG. 15(*b*) shows internal observation results in the HC state where the crack 14 has reached only the back surface 21*b*, FIG. 15(*c*) shows internal observation results in the full-cut state (inside is good) where the crack 14 has reached the back surface 21*b* and the surface 21*a*, and FIG. 15(*d*) shows internal observation results in the full-cut state (inside is poor) where the crack 14 has reached the back surface 21*b* and the surface 21*a*. FIGS. 15(*a*) to 15(*d*) show an observation result of the back surface 21*b* (incident surface), an observation result of the modified region 12*d* (SD4), and an observation result of the modified region 12*c* (SD3) in each state. Each internal observation result is acquired by aligning the focus F with each point from the back surface 21*b* side through the imaging unit 4 (based on a signal output from the imaging unit 4 that has detected light from each point).

On the incident surface, the crack 14 is not observed in the ST state of FIG. 15(*a*), and the crack 14 is observed in each of the states of FIGS. 15(*b*) to 15(*d*). In the modified region 12*d* (SD4), marks De are distinctly observed in the ST state of FIG. 15(*a*) and in the HC state of FIG. 15(*b*), but the marks De are vaguely observed in the full-cut states of FIGS. 15(*c*) and 15(*d*). In the modified region 12*c* (SD3), the marks De are distinctly observed in the ST state of FIG. 15(*a*) and in the HC state of FIG. 15(*b*), but the mark De is vaguely observed in the full-cut state (inside is good) of FIG. 15(*c*). In addition, in the full-cut state (inside is poor) of FIG. 15(*d*), when the focus F is aligned with the modified region 12*c* (SD3), a meandering portion of the crack 14 which becomes an end surface uneven spot after cutting is observed.

Figure 16:
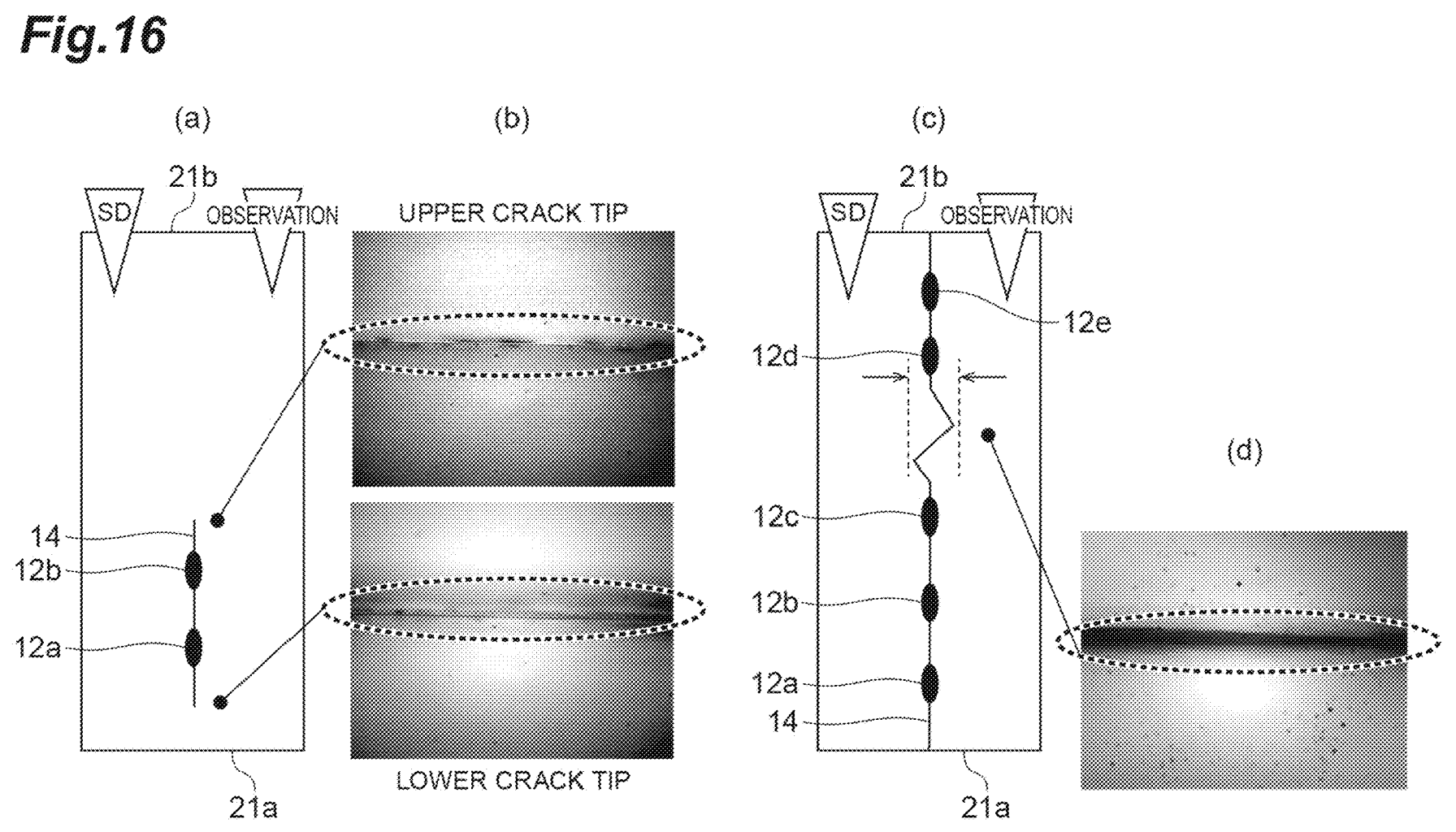

FIG. 16 shows views for illustrating the observation of a width of the crack 14 that meanders. FIG. 16(*a*) shows an example in which tips of the cracks 14 extending from the modified regions 12*a* and 12*b* in an up-down direction are observed, and FIG. 16(*c*) shows an example in which a width of the crack 14 (width of the shadow of the crack 14) meandering between the modified regions 12*c* and 12*d* is observed. In the state shown in FIG. 16(*a*), when the focus F is moved from the back surface 21*b* side toward the surface 21*a* side, the tip of the crack 14 extending from the modified region 12*b* toward the back surface 21*b* side is observed as shown in an upper view of FIG. 16(*b*). In addition, when the focus F is moved to the tip of the crack 14 extending from the modified region 12*a* toward the surface 21*a* side (or a point symmetric to the end of the crack 14 with respect to the surface 21*a*), the tip of the crack 14 extending from the modified region 12*b* toward the surface 21*a* side is observed as shown in a lower view of FIG. 16(*b*). Even when the width of the crack 14 meandering as shown in FIG. 16(*c*) is observed, similarly, the focus F is moved from the back surface 21*b* side toward the surface 21*a* side in the Z direction. Then, as shown in FIG. 16(*d*), when the focus F reaches the meandering portion of the crack 14, a region where the width of the shadow of the crack 14 is not constant is observed. The meandering portion of the crack 14 can be identified by observing the width of the shadow of the crack 14 is observed as described above.

Figure 17:
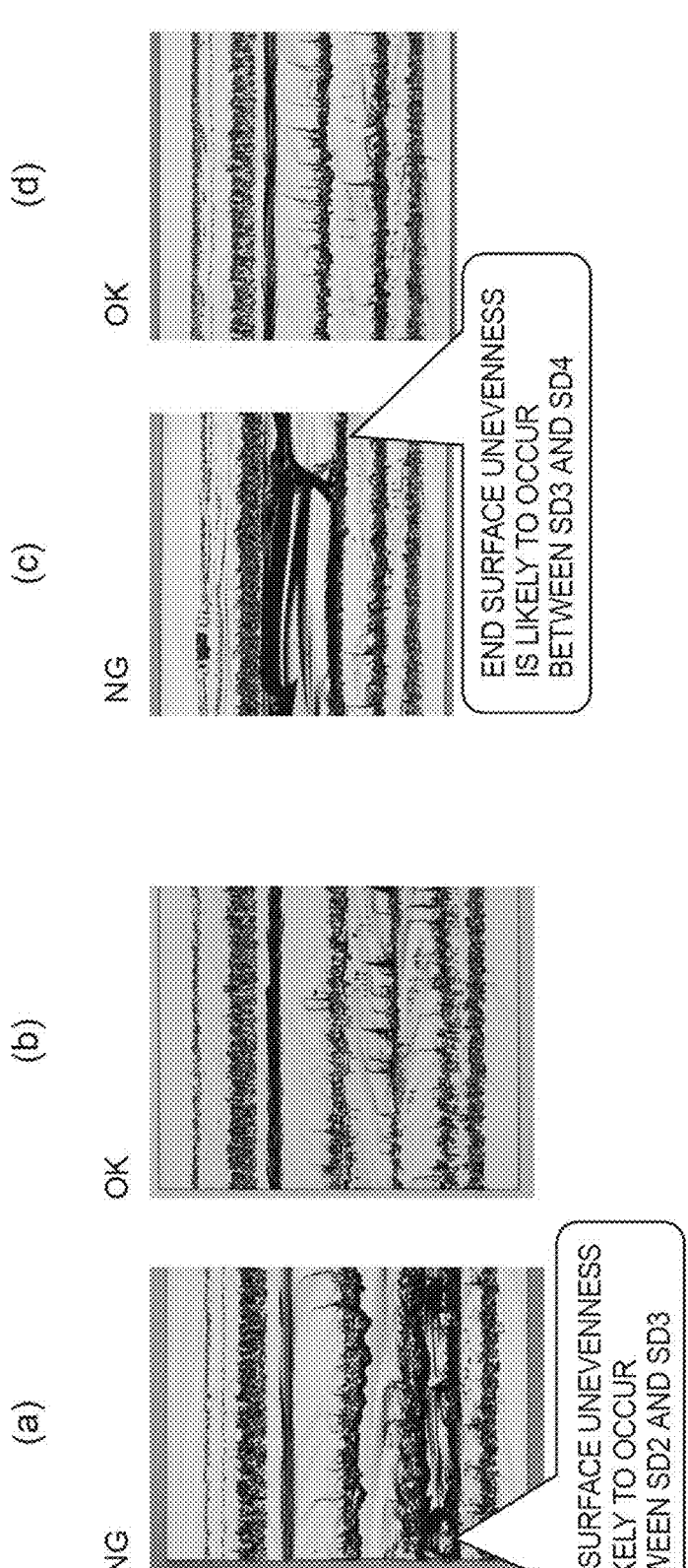
FIG. 17 shows views for describing an end surface unevenness occurrence region for each thickness of wafers.

FIG. 17 shows views for illustrating an end surface unevenness occurrence region (meandering portion of the crack 14) for each thickness of the wafers 20. FIG. 17(*a*) shows a cross-section of the wafer 20 which has a thickness of 500 μm and in which a meandering portion of the crack 14 is generated, FIG. 17(*b*) shows a cross-section of the wafer 20 which has a thickness of 500 μm and in which a meandering portion of the crack 14 is not generated, FIG.

17(c) shows a cross-section of the wafer 20 which has a thickness of 400 μm and in which a meandering portion of the crack 14 is generated, and FIG. 17(d) shows a cross-section of the wafer 20 which has a thickness of 400 μm and in which a meandering portion of the crack 14 is not generated. As shown in FIG. 17(a), in the wafer 20 having a thickness of 500 μm, the meandering portion (end surface unevenness occurrence region) of the crack 14 is generated between SD2 and SD3 that are modified regions, whereas as shown in FIG. 17(c), in the wafer 20 having a thickness of 400 μm, the meandering portion of the crack 14 (end surface unevenness occurrence region) is generated between SD3 and SD4 that are modified regions. As described above, a region where the meandering portion of the crack 14 is generated varies depending on the thickness of the wafer 20. For this reason, the control unit 8 may decide a position inside the wafer 20 at which the meandering of the crack 14 is assumed to be likely to occur, according to information regarding the wafer 20 (for example, the thickness of the wafer 20) or to laser processing conditions (for example, a laser condensing position inside the wafer 20 and the like), determine whether or not a meandering width of the crack 14 at the decided position is larger than a predetermined value, and determine a crack state inside the wafer 20.

In the processing condition derivation process, the control unit 8 is configured to execute: a decision process of deciding a recipe (processing conditions) including laser beam irradiation conditions of the laser irradiation unit 3, based on information received by the display 150; a processing process (first process) of controlling the laser irradiation unit 3 according to the recipe (processing conditions) set such that a plurality of the modified regions 12 are formed inside the wafer 20 by irradiating the wafer 20 with the laser beam and a full-cut state where the cracks 14 extending from the modified regions 12 have reached the back surface 21b and the surface 21a is attained; an identification process (second process) of identifying a state of the crack 14 on the back surface 21b which extends from the modified region 12, and a state of at least one of the modified regions 12 and the cracks 14 inside the wafer 20, based on a signal output from the imaging unit 4 that has detected light; a determination process (third process) of determining whether or not a dicing force applied to the wafer 20 according to the recipe is proper, based on information identified in the identification process; and a correction process (fourth process) of correcting the recipe to set the dicing force within a proper range when it is determined in the determination process that the dicing force is not proper.

Figure 18:
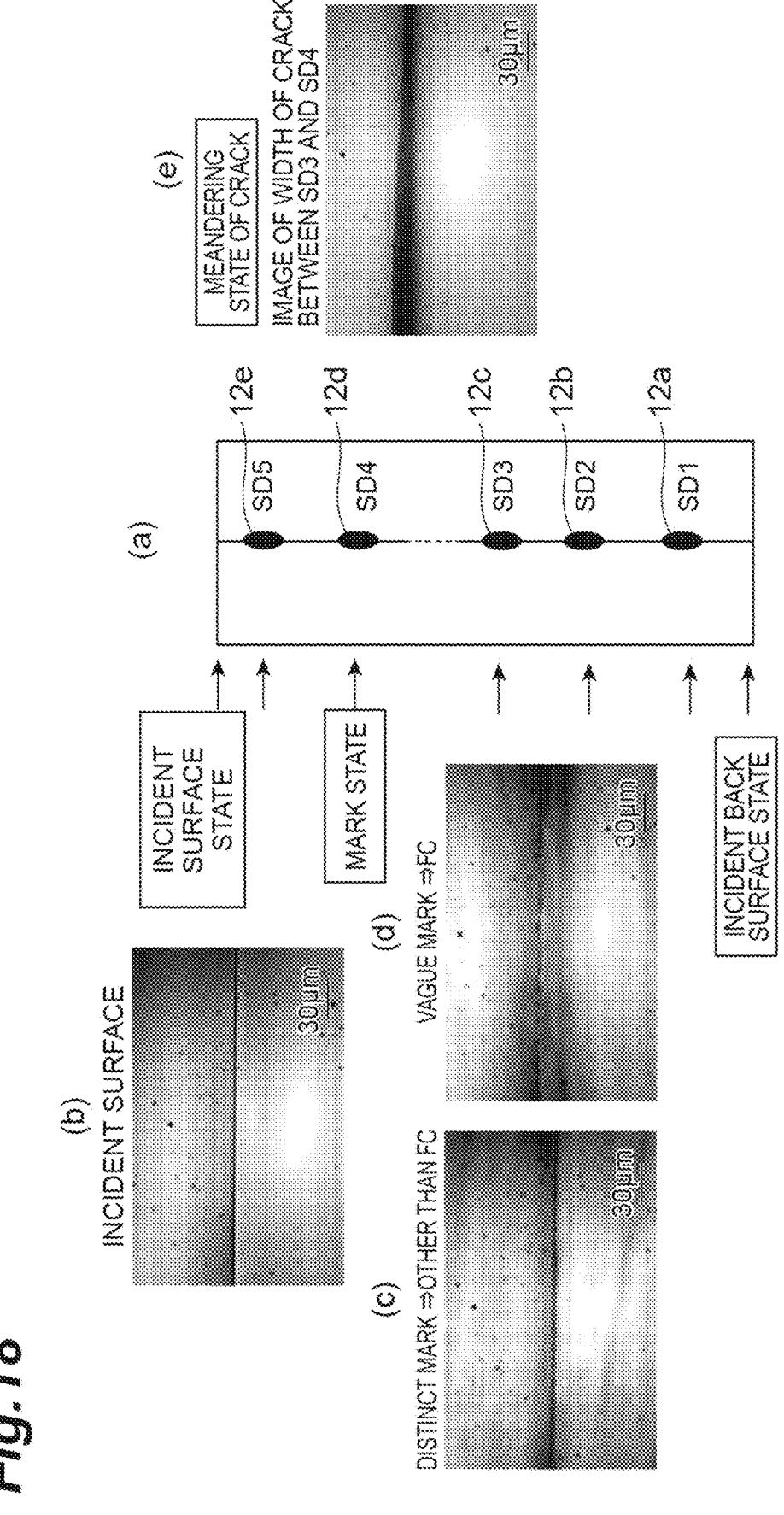
FIG. 18 shows views for describing a processing condition derivation process.

FIG. 18 shows views for illustrating an outline of the processing condition derivation process. In the processing condition derivation process, as described above, the processing process of the wafer 20 is performed according to the recipe (processing condition) set to attain the full-cut state, and it is determined whether or not the dicing force (dicing force under a full-cut condition) applied to the wafer 20 is proper, based on the state of the crack 14 on the back surface 21b and on the internal state of the wafer 20. Specifically, as shown in FIG. 18, observation results of an incident surface state, a mark state, a meandering state of cracks, and an incident back surface state are referred to in the determination as to whether or not the dicing force is proper. FIG. 18(a) schematically shows the wafer 20 in the full-cut state where the cracks 14 have reached the back surface 21b and the surface 21a. In the wafer 20, the incident surface state (state of the back surface 21b) is observed as shown in FIG. 18(b) to determine whether or not the HC state where the crack 14 has reached the back surface 21b is attained, and whether or not a width of the crack 14 on the back surface 21b in the direction intersecting the Z direction that is the thickness direction of the wafer 20 is larger than a predetermined value. In addition, the mark state is observed to determine whether the mark is distinct and clear (refer to FIG. 18(c)) or the mark is vague and unclear (refer to FIG. 18(d)). In addition, a width of the shadow of the crack 14 between the modified regions (for example, between SD3 and SD4) (refer to FIG. 18(e)) is observed to determine whether or not the width of the crack is larger than a predetermined value. In addition, the incident back surface state (state of the surface 21a) is observed to determine whether or not the BHC state where the crack 14 has reached the surface 21a is attained. Hereinafter, each process of the processing condition derivation process will be described.

(Decision Process)

The decision process will be described with reference to FIGS. 19 to 21. In the decision process, first, the display 150 receives a user's input of wafer processing information. The wafer processing information is information for deciding a recipe (processing condition). FIG. 19 is one example of a setting screen for wafer processing information (user input reception screen) to be displayed on the display 150. As shown in FIG. 19, the display 150 displays "FC determination", "wafer thickness", "device type", and "processing setting". The "FC determination" is information indicating that after a modified region (modified region to be formed last) assumed to be in the full-cut state is formed, a determination related to the dicing force under the full-cut condition is performed. In the example shown in FIG. 19, the "FC determination" is set to "execution", and a user's input (a change in determination mode made by a user) is not received on this setting screen. The "wafer thickness" is information indicating a thickness of the wafer 20. For example, the "wafer thickness" is selected from a plurality of options and is input by the user. The "device type" is information indicating a type of the wafer 20. The "device type" is indicated by, for example, a type such as a "0°" product or a "45°" product according to the position of the notch. For example, the "device type" is selected from a plurality of options and is input by the user. The "processing setting" is setting information related to laser processing desired by the user. For example, the "processing setting" is selected from a plurality of options and is input by the user. At least one of the "wafer thickness", the "device type", and the "processing setting" may be input. When the input on the setting screen of FIG. 19 is completed, the display 150 transitions to the screen of FIG. 20.

FIG. 20 is one example of a determination content confirmation screen to be displayed on the display 150. The determination content confirmation screen is a screen for displaying information related to determinations (determinations after processing) to be executed based on contents input on the setting screen of FIG. 19. As shown in FIG. 20, determination contents and determination criteria are mainly displayed on the determination content confirmation screen. In the determination contents, contents of the "FC determination", the "wafer thickness", the "device type", and the "processing setting" set on the setting screen of FIG. 19 (or derived from the set information) are displayed. In the determination criteria, pass criteria in the determination process are displayed, pass criteria for "crack state of the incident surface" and "HC straightness" are displayed as pass criteria of a laser incident surface inspection (inspection of a state of the crack 14 on the back surface 21b which extends from the modified region 12), and pass criteria for "crack state of the incident back surface", "end surface unevenness position", "end surface unevenness width", and "mark observation" are displayed as pass criteria of a wafer internal inspection (inspect of states of the modified region 12 and of the crack 14 inside the wafer 20). The "crack state of the incident surface" is information indicating whether or not the crack 14 has reached the back surface 21*b* that is an incident surface of the laser beam. In order to perform a determination related to the dicing force under the full-cut condition, the pass criterion for the "crack state of the incident surface" is set to the HC state. The "HC straightness" is information indicating a meandering width of the crack 14 in the direction intersecting the Z direction, the crack 14 being observed on the back surface 21*b*. The pass criterion for the "HC straightness" can be input (selected) by the user. The "crack state of the incident back surface" is information indicating whether or not the crack 14 has reached the surface 21*a*. In order to perform a determination on the dicing force under the full-cut condition, the pass criterion for the "crack state of the incident back surface" is set to the BHC. The "end surface unevenness position" is information indicating a position where a determination related to end surface unevenness (meandering of the crack 14) is performed. The "end surface unevenness position" is defined to be, for example, a position between the modified regions such as "between SD3 and SD4". Information of the "end surface unevenness position" can be input (selected) by the user. The "end surface unevenness width" is information indicating a meandering width of the crack 14 in the direction intersecting the Z direction, the crack 14 being observed at the position defined as the "end surface unevenness position". The pass criterion for the "end surface unevenness width" can be input (selected) by the user. The "mark observation" is information indicating an observation result related to the clearness of a mark in each modified region. In order to perform a determination related to the dicing force under the full-cut condition, the pass criterion for the "mark observation" is set to "being vague". When the input and the confirmation on the confirmation screen of FIG. 20 are completed, the display 150 transitions to the screen of FIG. 21.

FIG. 21 is one example of a processing condition confirmation screen to be displayed on the display 150. The processing condition confirmation screen is a screen for displaying the recipe (processing condition) decided by the control unit 8 based on the contents input on the setting screen of FIG. 19. As shown in FIG. 21, the processing condition confirmation screen displays "processing number", "Z height (ZH)", "VD", "number of focuses", "pulse energy", "condensing state parameter", "processing speed", "frequency", and "pulse width". The Z height is information indicating a processing depth (height) when laser processing is performed. The VD is a Z interval between the SD layers when multi-focus processing is performed. The condensing state parameter is a parameter for varying a laser condensing state such as a spherical aberration or an astigmatism. Each information to be displayed on the processing condition confirmation screen can be corrected by a user's input. Incidentally, an optimum condensing correction amount (for example, a spherical aberration) differs between a shallow position and a deep position inside the silicon of the wafer 20. In a full-cut process, since the amount of scanning in the Z direction is large, a more detailed image can be captured by changing the condensing correction amount for each Z position.

(Processing Process)

In the processing process, the control unit 8 controls the laser irradiation unit 3 according to the recipe (processing condition) decided and set in the decision process. The set recipe is a recipe set such that the plurality of modified regions 12 are formed inside the wafer 20 by irradiating the wafer 20 with the laser beam and the full-cut state where the cracks 14 extending from the modified regions 12 have reached the back surface 21*b* and the surface 21*a* is attained. In the processing process, the control unit 8 controls the laser irradiation unit 3 to form the plurality of modified regions 12.

(Identification Process)

In the identification process, the control unit 8 identifies a state of the crack 14 on the back surface 21*b* which extends from the modified region 12, and a state of at least one of the modified regions 12 and the cracks 14 inside the wafer 20, based on a signal output from the imaging unit 4 that has detected light. Namely, the control unit 8 identifies a state of the crack 14 on the back surface 21*b* which extends from the modified region 12, and a state of at least one of the modified regions 12 and the cracks 14 inside the wafer 20, based on observation results of the back surface 21*b* and of the inside of the wafer 20 obtained by the imaging unit 4. In the present embodiment, the control unit 8 executes the identification process after all the modified regions 12 (modified region 12 to be formed last) are formed.

The control unit 8 identifies a reach state of the crack 14 on the back surface 21*b* based on an observation result of the back surface 21*b* obtained by the imaging unit 4. Specifically, the control unit 8 identifies whether the ST state where the crack 14 has not reached the back surface 21*b* is attained or the HC state where the crack 14 has reached the back surface 21*b* is attained. The control unit 8 identifies a meandering width of the crack 14 on the back surface 21*b* in the direction intersecting the thickness direction (Z direction) of the wafer 20, based on an observation result of the back surface 21*b* obtained by the imaging unit 4.

The control unit 8 identifies a meandering width of the crack 14 in the direction intersecting the thickness direction (Z direction) of the wafer 20 inside the wafer 20, based on an observation result of the inside of the wafer 20 (for example, between the plurality of modified regions 12) obtained by the imaging unit 4. The control unit 8 may decide a position inside the wafer 20 at which the meandering of the crack 14 is assumed to be likely to occur, according to the information regarding the wafer 20 (for example, the thickness of the wafer 20) or to laser processing conditions (for example, a laser condensing position and the like) input by the user (or estimated), and identify a meandering width of the crack 14 based on an observation result at the decided position. Alternatively, the control unit 8 may acquire observation results over the entire range in the thickness direction (Z direction) of the wafer 20, and identify a maximum value of the meandering width of the crack 14.

The control unit 8 identifies a clearness of the mark De of the laser beam related to the modified region 12, based on an observation result of the inside of the wafer 20 (for example, each of the modified regions 12) obtained by the imaging unit 4. Specifically, when the mark De is clearer than a predetermined clearness, the control unit 8 identifies that the mark De is distinct, and when the mark De is not clearer than the predetermined clearness, the control unit 8 identifies that the mark De is vague. The control unit 8 identifies a reach state of the crack 14 on the surface 21*a* based on an observation result of the surface 21*a* obtained by the imaging unit 4. Specifically, the control unit 8 identifies whether the ST state where the crack 14 has not reached the surface 21a is attained or the BHC state where the crack 14 has reached the surface 21a is attained.

(Determination Process)

In the determination process, the control unit 8 determines whether or not the dicing force applied to the wafer 20 according to the recipe is proper (proper as a dicing force under the full-cut condition), based on the information identified in the identification process. When the identified reach state of the crack 14 is the ST state where the crack 14 has not reached the back surface 21b, the control unit 8 determines that the dicing force has not reached a proper range and is not proper. When the identified meandering width of the crack 14 on the back surface 21b is larger than a predetermined value (for example, several μm to several tens of μm), the control unit 8 determines that the dicing force is out of the proper range and is not proper.

When the identified meandering width of the crack 14 inside the wafer 20 is larger than a predetermined value (for example, several μm to several tens of μm), the control unit 8 determines that the dicing force is out of the proper range and is not proper. When the identified clearness of the mark is higher than a predetermined clearness and the mark is distinct, the control unit 8 determines that the dicing force has not reached the proper range and is not proper. When the identified reach state of the crack 14 is the ST state where the crack 14 has not reached the surface 21a, the control unit 8 determines that the dicing force has not reached the proper range and is not proper.

Figure 22:
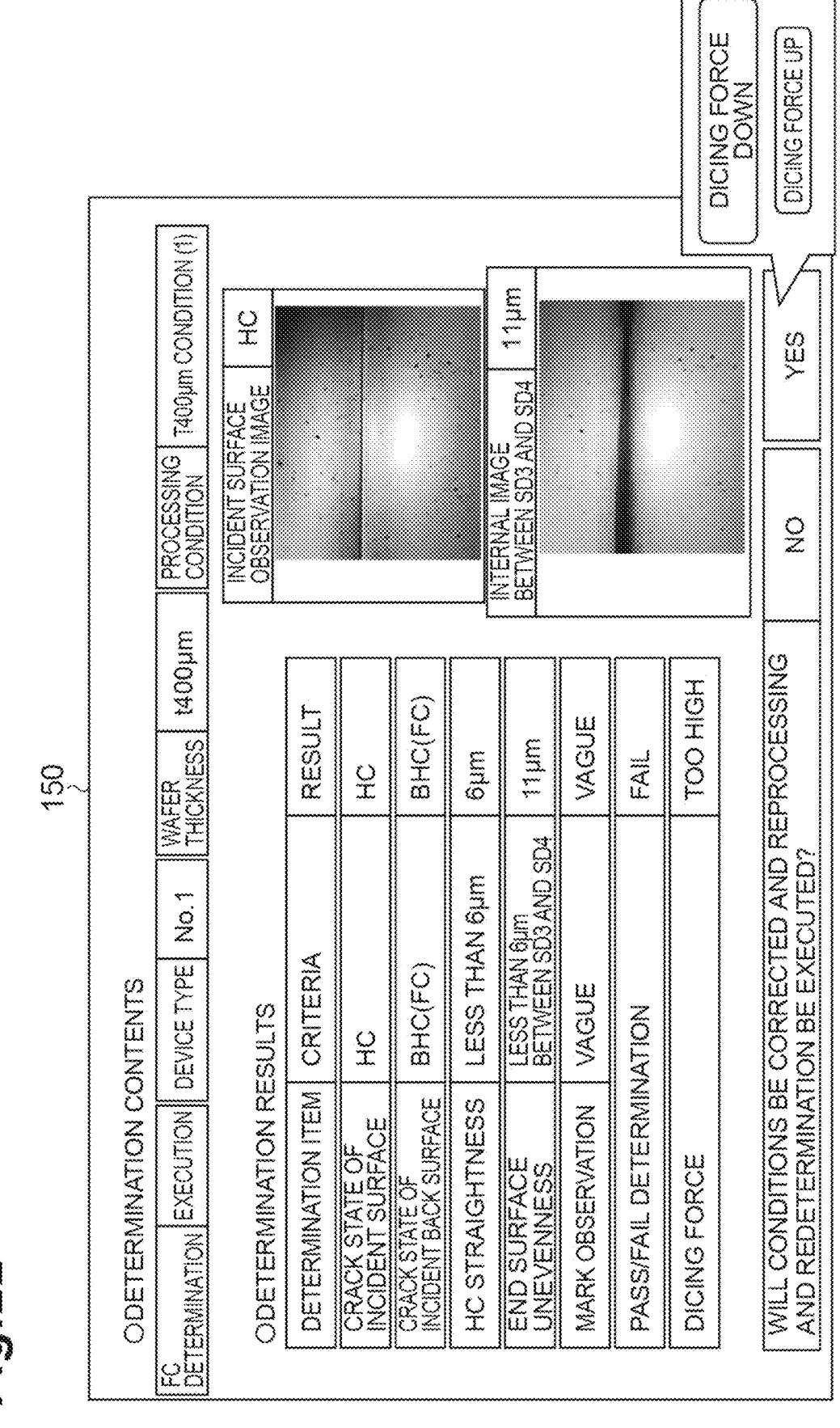
FIG. 22 is a screen image related to the processing condition derivation process.

FIG. 22 is one example of a determination result confirmation screen to be displayed on the display 150. The determination result confirmation screen is a screen that displays determination results in the determination process, and that receives a user's input related to the correction of the recipe. In the example shown in FIG. 22, as determination results, determination items, criteria (pass criteria), and results are shown. Now, regarding an item of "end surface unevenness" (width of the crack 14 inside the wafer), the pass criterion is 6 μm whereas the determination result is 11 μm, and it is considered that the dicing force is too large. In this case, since the correction of the recipe is recommended, a message "will the conditions be corrected and reprocessing and redetermination be executed?" is displayed, and correction can be executed to decrease the dicing force according to a user's input. Incidentally, as shown in FIG. 22, the determination result confirmation screen may display an observation image of the incident surface (image indicating whether the HC is attained or the ST is attained) and an image showing the width of the crack 14 inside the wafer.

(Correction Process)

In the correction process, when it is determined in the determination process that the dicing force is not proper, the control unit 8 corrects the recipe to set the dicing force within a proper range. The control unit 8 corrects the recipe to increase or decrease the dicing force. The control unit 8 performs correction to adjust, for example, the processing number, the Z height (ZH), the VD, the number of focuses, the pulse energy, the condensing state parameter, the processing speed, the frequency, the pulse width, or the like in the recipe. FIG. 23 is one example of a processing condition correction screen to be displayed on the display 150. In the example shown in FIG. 23, in order to decrease the dicing force, correction to reduce the pulse width of each pass (correction to make the pulse width smaller than that of the initial recipe shown in FIG. 21) is executed. Such correction may be executed by receiving a user's input on the display 150 or may be automatically executed.

After the correction process is performed, the control unit 8 executes the processing process, the identification process, and the determination process again according to the corrected recipe. FIG. 24 is one example of a determination result confirmation screen to be displayed on the display 150 when the processing process, the identification process, and the determination process are executed again after the correction process. The determination result confirmation screen after the correction process displays a determination results before the correction process (a first result in FIG. 24) and a determination result after the correction process (a second result in FIG. 24). In the determination result after the correction process shown in FIG. 24, all determination items satisfy the pass criteria, and the pass/fail determination is set to "pass". Incidentally, even when the pass/fail determination is "pass", correction may be performed to adjust the dicing force based on a user's input according to the determination result.

[Inspection Method]

Figure 25:
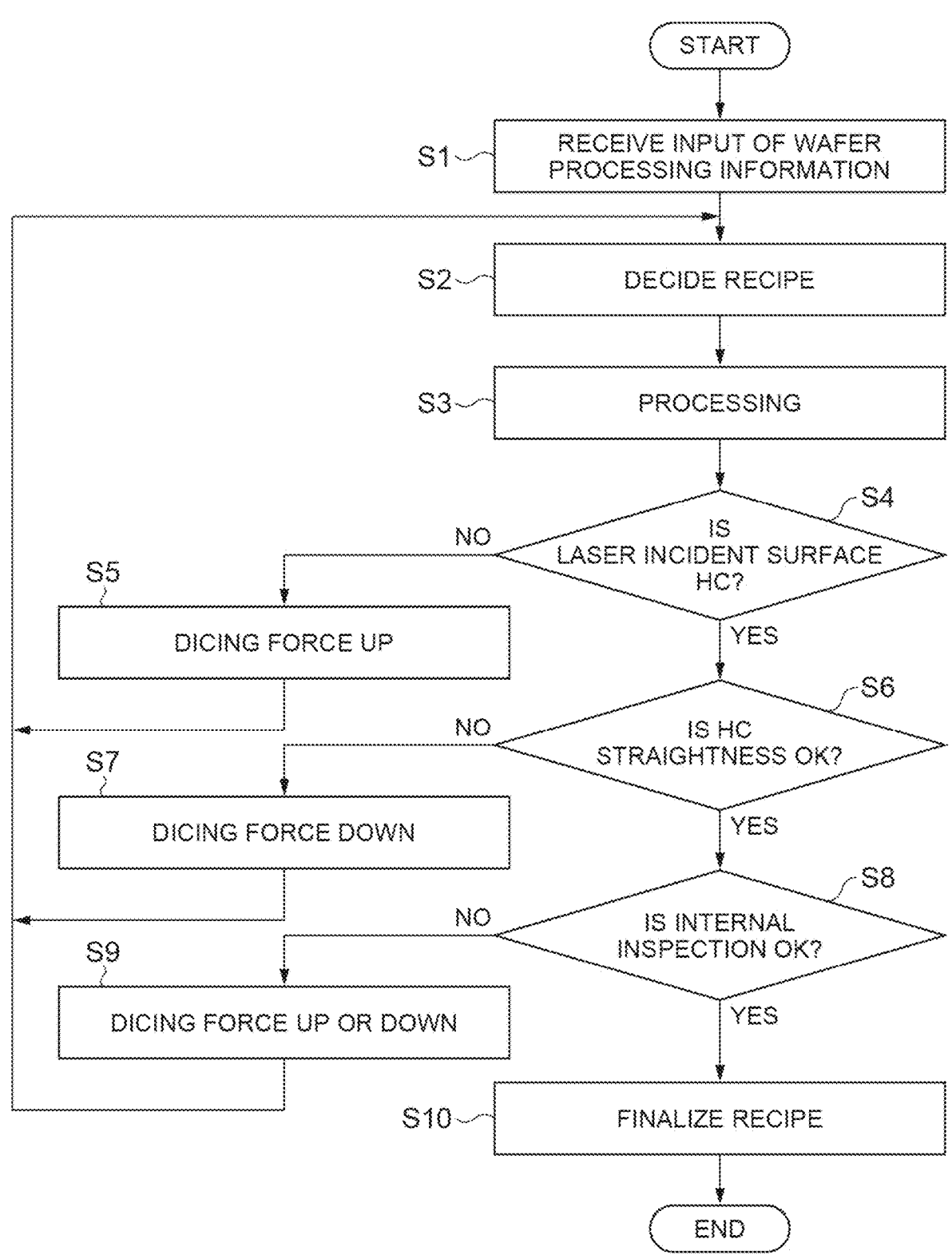
FIG. 25 is a flowchart of an inspection method (processing condition derivation process).

An inspection method of the present embodiment will be described with reference to FIG. 25. FIG. 25 is a flowchart of the inspection method. FIG. 25 is a flowchart showing the processing condition derivation process to be executed as a pre-process of the process of forming modified regions in the wafer 20, in the inspection method to be executed by the inspection device 1. Incidentally, processes of steps S4, S6, and S8 may be executed in an order other than the order in the flowchart.

As shown in FIG. 25, in the processing condition derivation process, initially, the display 150 receives a user's input of wafer processing information (step S1). Specifically, the display 150 receives a user's input of various information shown in FIG. 19.

Subsequently, the control unit 8 decides a recipe (processing condition) including laser beam irradiation conditions of the laser irradiation unit 3, based on the information received by the display 150. Specifically, the control unit 8 decides the recipe as shown in FIG. 21 (step S2). The recipe is a recipe set such that the plurality of modified regions 12 are formed inside the wafer 20 by irradiating the wafer 20 with the laser beam and the full-cut state where the cracks 14 extending from the modified regions 12 have reached the back surface 21b and the surface 21a is attained.

Subsequently, the control unit 8 controls the laser irradiation unit 3 based on the decided recipe, to process the wafer 20 (step S3). In the processing process, the control unit 8 controls the laser irradiation unit 3 to form the plurality of modified regions 12.

Subsequently, the control unit 8 identifies a reach state of the crack 14 on the back surface 21b based on an observation result of the laser incident surface (back surface 21b) obtained by the imaging unit 4, and determines whether or not the back surface 21b is in the HC state (step S4). When it is determined in step S4 that the HC state is not attained, the control unit 8 corrects the recipe to increase the dicing force (step S5). In this case, the processes after step S2 are executed again.

When it is determined in step S4 that the HC state is attained, the control unit 8 identifies the straightness of the crack 14 (meandering width of the crack 14) on the back surface 21b based on an observation result of the laser incident surface (back surface 21b) obtained by the imaging unit 4, and determines whether or not the meandering width of the crack 14 is smaller than a predetermined value (for example, several μm to several tens of μm) (whether or not the straightness is OK) (step S6). When it is determined in step S6 that the straightness is NG, the control unit 8 corrects the recipe to decrease the dicing force (step S7). In this case, the processes after step S2 are executed again.

When it is determined in step S6 that the straightness is OK, the control unit 8 determines whether or not the internal inspection of the wafer 20 is OK (step S8). The fact that the internal inspection is OK refers to satisfying, for example, a condition that the meandering width of the crack 14 inside the wafer 20 is smaller than the predetermined value (for example, several μm to several tens of μm), the mark De is vague, and the BHC state where the crack 14 has reached the surface 21a is attained. When it is determined in step S8 that the internal inspection is NG, the control unit 8 corrects the recipe to increase or decrease the dicing force according to an NG reason (step S9). In this case, the processes after step S2 are executed again. On the other hand, when it is determined in step S8 that the internal inspection is OK, the recipe is finalized (the decided recipe is finalized) (step S10), and the processing condition derivation process ends.

Actions and Effects

Next, actions and effects of the inspection device 1 according to the present embodiment will be described.

The inspection device 1 according to the present embodiment includes the laser irradiation unit 3 that irradiates the wafer 20 with a laser beam from the back surface 21b side of the wafer 20 having the back surface 21b and the surface 21a; the imaging unit 4 that outputs light having a property of transmitting through the wafer 20, and that detects the light that has propagated through the wafer 20; and the control unit 8. The control unit 8 is configured to execute: the processing process of controlling the laser irradiation unit 3 according to the recipe set such that the plurality of modified regions 12 are formed inside the wafer 20 by irradiating the wafer 20 with the laser beam and the full-cut state where the cracks 14 extending from the modified regions 12 have reached the back surface 21b and the surface 21a is attained; the identification process of identifying a state of the crack 14 on the back surface 21b which extends from the modified region 12, and a state of at least one of the modified regions 12 and the cracks 14 inside the wafer 20, based on a signal output from the imaging unit 4 that has detected light; and the determination process of determining whether or not a dicing force applied to the wafer 20 according to the recipe is proper, based on information identified in the identification process.

The inspection device 1 applies the laser beam according to the recipe set to attain the full-cut state where the cracks 14 extending from the modified regions 12 have reached the back surface 21b and the surface 21a of the wafer 20. Then, the state of the crack on the back surface 21b and the state of at least one of the modified regions 12 and the cracks 14 inside the wafer 20 are identified, and it is determined whether or not the dicing force applied to the wafer 20 according to the recipe is proper, based on the identified information. As described above, since in addition to the state of the crack 14 on the back surface 21b that is an incident surface of the laser beam, the state of at least one of the modified regions 12 and the cracks 14 inside the wafer 20 are identified, in consideration of not only information regarding an end surface (back surface 21b) of the wafer 20 but also information regarding the inside of the wafer 20, it is determined whether or not the dicing force applied to the wafer 20 to attain the full-cut state is proper. Therefore, for example, when the full-cut state is attained but the internal quality of the wafer 20 decreases, it can be determined that the dicing force is not proper. Accordingly, the quality of the wafer 20 to be processed into the full-cut state can be ensured.

In the identification process, the control unit 8 may identify a meandering width of the crack 14 in the direction intersecting the thickness direction of the wafer 20 inside the wafer 20, and in the determination process, when the identified meandering width of the crack 14 is larger than the predetermined value, the control unit 8 may determine that the dicing force is out of the proper range and is not proper. When the dicing force is too large, it is considered that the crack 14 greatly meanders in the direction intersecting the thickness direction of the wafer 20 inside the wafer 20. A spot where the crack 14 meanders as described above becomes an end surface uneven spot after the wafer 20 is cut. For this reason, when the meandering width of the crack 14 is large, it is determined that the dicing force is too large, and the correction of the dicing force or the like is executed as necessary, so that the occurrence of an uneven spot in the end surface can be suppressed, and the quality of the wafer 20 to be processed into the full-cut state can be appropriately ensured.

In the identification process, the control unit 8 may decide a position inside the wafer 20 at which the meandering of the crack 14 is assumed to be likely to occur, according to the information regarding the wafer 20, and identify a meandering width of the crack 14 at the decided position. The spot where the meandering of the crack 14 is likely to occur can be predicted to some extent by, for example, the thickness of the wafer 20, the laser condensing position inside the wafer 20, or the like. For this reason, the meandering width of the crack 14 at the position inside the wafer 20 at which the meandering of the crack 14 is assumed to be likely to occur is identified in consideration of the information regarding the wafer 20 such as the thickness of the wafer 20, so that a determination related to the meandering width of the crack 14 can be efficiently and appropriately performed.

In the identification process, the control unit 8 may identify a clearness of the mark of the laser beam related to the modified region 12, and in the determination process, when the identified clearness of the mark is higher than the predetermined value, the control unit 8 may determine that the dicing force has not reached a proper range and is not proper. When the full-cut state is attained, the mark related to the modified region 12 is vaguely observed and the clearness is low. On the other hand, when the full-cut state is not attained, the mark related to the modified region 12 is distinctly observed and the clearness is high. For this reason, when the clearness of the mark is high, it is determined that the dicing force is small, and correction or the like to increase the dicing force is executed as necessary, so that the full-cut state can be reliably attained, and the quality of the wafer 20 to be processed into the full-cut state can be appropriately ensured.

In the identification process, the control unit 8 may identify a reach state of the crack 14 on the back surface 21b, and in the determination process, when the identified reach state of the crack 14 is the ST state where the crack 14 has not reached the back surface 21b, the control unit 8 may determine that the dicing force is out of a proper range and is not proper. When the HC state where the crack 14 has reached the back surface 21b is not attained (the ST state is attained), naturally, the full-cut state is not attained. For this reason, when the HC state is not attained, it is determined that the dicing force is small, and correction or the like to increase the dicing force is executed as necessary, so that the full-cut state can be reliably attained, and the quality of the wafer 20 to be processed into the full-cut state can be appropriately ensured.

In the identification process, the control unit 8 may identify a meandering width of the crack 14 on the back surface 21*b* in the direction intersecting the thickness direction of the wafer 20, and in the determination process, when the identified meandering width of the crack 14 is larger than the predetermined value, the control unit 8 may determine that the dicing force is out of a proper range and is not proper. When the crack 14 on the back surface 21*b* greatly meanders in the direction intersecting the thickness direction of the wafer 20, it is considered that the dicing force is too large. For this reason, when the meandering width of the crack 14 on the back surface 21*b* is larger than the prede-termined value, it is determined that the dicing force is large, and correction or the like to reduce the dicing force is executed as necessary, so that the quality of the wafer 20 to be processed into the full-cut state can be appropriately ensured.

In the identification process, the control unit 8 may identify a reach state of the crack 14 on the surface 21*a*, and in the determination process, when the identified reach state of the crack 14 is the ST state where the crack 14 has not reached the surface 21*a*, the control unit 8 may determine that the dicing force has not reached a proper range and is not proper. When the BHC state where the crack 14 has reached the surface 21*a* is not attained (the ST state is attained), naturally, the full-cut state is not attained. For this reason, when the BHC state is not attained, it is determined that the dicing force is small, and correction or the like to increase the dicing force is executed as necessary, so that the full-cut state can be reliably attained, and the quality of the wafer 20 to be processed into the full-cut state can be appropriately ensured.

The control unit 8 is configured to further execute the correction process of correcting the recipe to set the dicing force within a proper range when it is determined in the determination process that the dicing force is not proper, and may execute the processing process, the identification pro-cess, and the determination process again according to the recipe corrected in the correction process. As described above, since each process is executed again according to the recipe corrected to set the dicing force within the proper range, it can be determined whether or not the corrected recipe is proper, and the proper recipe can be reliably derived.

The control unit 8 may control the laser irradiation unit 3 to form the plurality of modified regions 12 in the processing process, and execute the identification process and the determination process after the modified region 12 to be formed last in the processing process is formed. Accord-ingly, it can be determined whether or not the dicing force applied to the wafer 20 to attain the full-cut state is proper, based on a state of the wafer after all the modified regions 12 are formed (namely, a state that should be the full-cut state).

The embodiment of the present invention has been described above, but the present invention is not limited to the embodiment. For example, the control unit 8 may be configured to further execute a pre-identification process of identifying information related to the modified regions 12 and to the cracks 14 extending from the modified regions 12 before the modified region 12 to be formed last is formed, based on a signal output from the imaging unit 4 that has detected light; and a pre-determination process of determin-ing whether or not a state before the modified region 12 to be formed last is formed is proper, based on the information identified in the pre-identification process. In the full-cut state (state where the modified region 12 to be formed last is formed), it may be difficult to observe a detailed internal state of the wafer 20. In this respect, the information related to the modified regions 12 and to the cracks 14 before the modified region 12 to be formed last is formed is observed (identified), and it is determined whether or not the state before the modified region 12 to be formed last is formed is proper, so that an observation result of the detailed internal state of the wafer 20 can be taken into consideration, and the quality of the wafer 20 to be processed into the full-cut state can be ensured.

Figure 26:
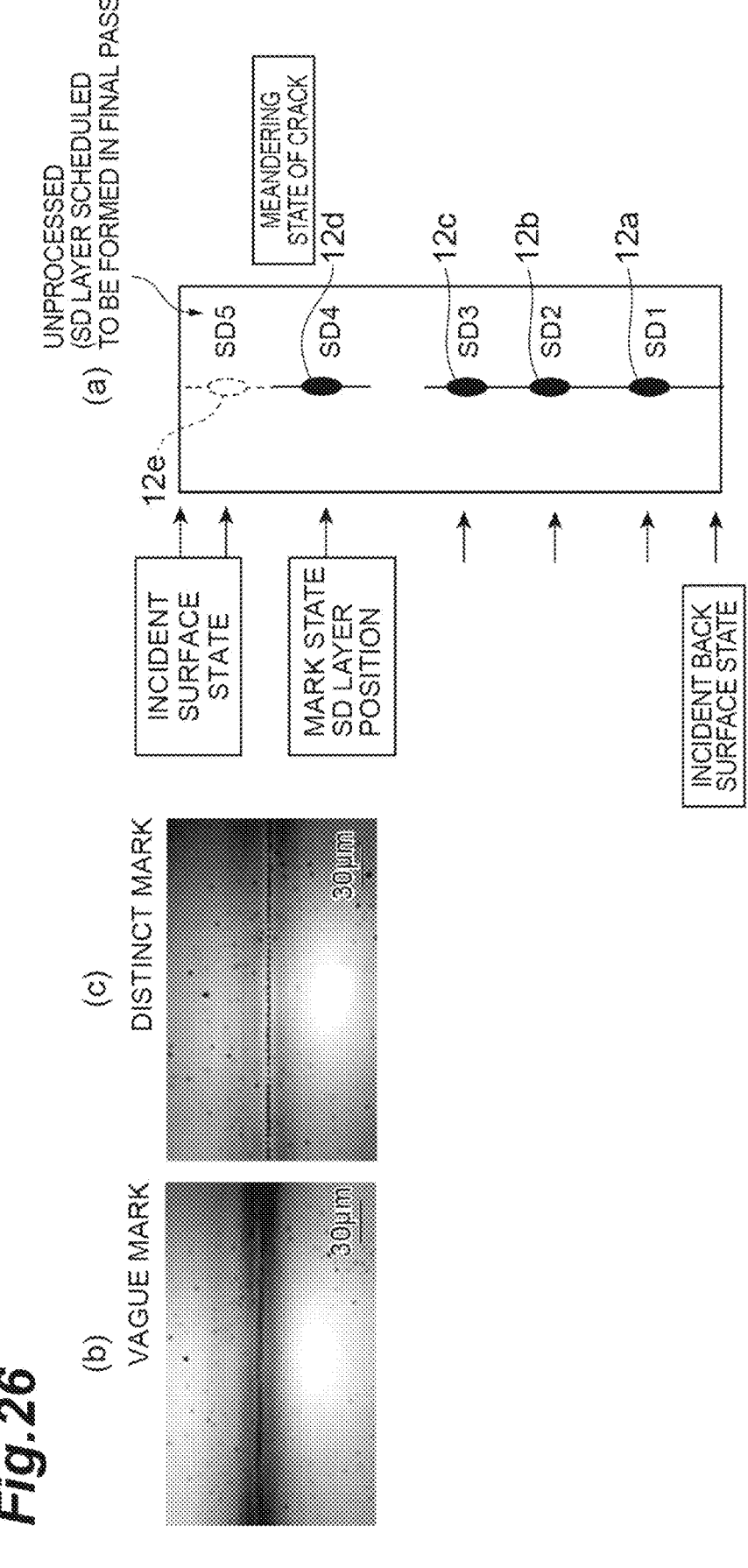
FIG. 26 shows views for describing a processing condition derivation process according to a modification example.

FIG. 26 shows views for illustrating an outline of a determination as to whether or not the dicing force is proper in a processing condition derivation process according to a modification example. As shown in FIG. 26(*a*), in the present modification example, before the modified region 12*e* (SD5) scheduled to be formed in a final pass is formed, the pre-identification process and the pre-determination pro-cess described above are executed. In the pre-identification process, as shown in FIG. 26(*a*), in addition to an incident surface state, a mark state, the positions of the modified regions (SD layers), an incident back surface state, and the like inside the wafer 20 are identified. In a determination (FC determination) after the final modified region 12*e* is formed, the pass criterion for the determination (pass crite-rion of being the full-cut state) is that the mark is vague (refer to FIG. 26(*b*)), but in a pre-determination (FC-1) before the final modified region 12*e* is formed, the pass criterion for the determination is that the mark is distinct (refer to FIG. 26(*c*)). This difference is due to the fact that a state of being the full-cut state is normal in the FC determination whereas a state of not being the full-cut state is normal in the FC-1 determination. Namely, in the FC-1 determination, when the mark is vague, it is considered that an uneven portion of the crack 14 exists inside the wafer and it is difficult to visually recognize the mark of the modified region under the uneven portion because of the uneven portion, and when the final modified region 12*e* is formed, the occurrence of end surface unevenness is expected, so that a determination result is a fail (the pre-determination is NG). As described above, when the FC-1 determination is performed, a detailed internal state of the wafer 20 can be better observed compared to the case of the full-cut state, so that in addition to the above-described items, an inspection for the presence or absence of a black streak, an inspection for a black streak position, a BHC inspection, a crack amount inspection, and the like may be executed.

Figure 28:
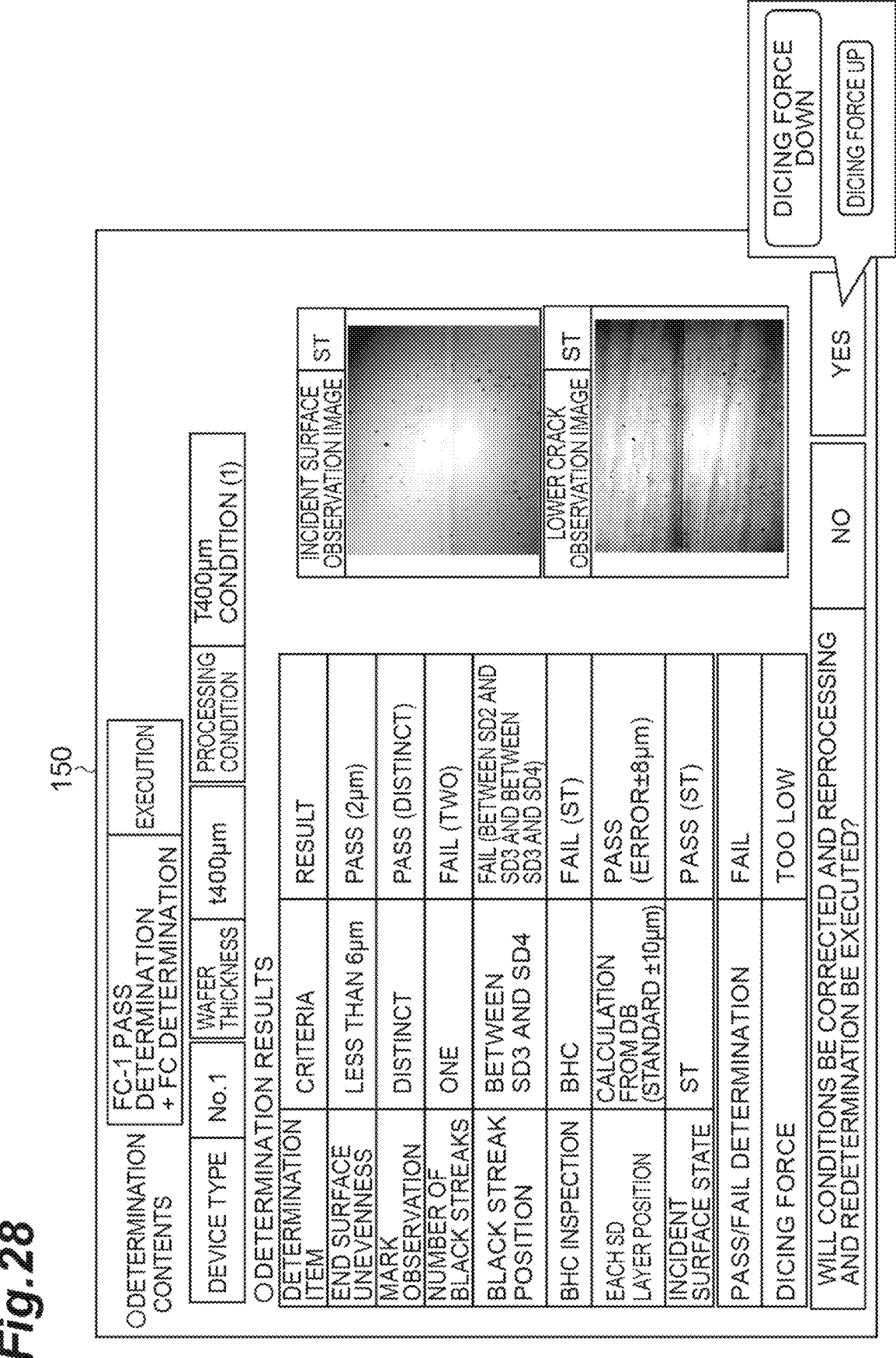
FIG. 28 is a screen image related to the processing condition derivation process according to the modification example.

FIG. 27 is one example of a determination content con-firmation screen related to the pre-determination (FC-1 determination) which is to be displayed on the display 150. In a determination criteria (pass criteria for the FC-1 deter-mination), for example, pass criteria for "end surface unevenness", "mark observation", "number of black streaks", "black streak position", "BHC inspection", "each SD layer position", and "incident surface state" are dis-played. FIG. 28 is one example of a determination result confirmation screen to be displayed on the display 150. In the example shown in FIG. 28, a case is shown in which the "number of black streaks", the "black streak position", and the "BHC inspection" do not satisfy the respective pass criteria and are determined as a fail and the dicing force is too low. In this case, correction to increase the dicing force can be executed according to a user's input. Namely, the control unit 8 is configured to further execute a pre-correc-tion process of correcting the recipe when it is determined in the pre-determination process that the state before the modified region 12 to be formed last is formed is not proper. Then, the control unit 8 executes the processing process, the pre-identification process, and the pre-determination process again according to the recipe corrected in the pre-correction process. As described above, the recipe is corrected when it is determined in the pre-determination process that the state is not proper, so that the quality of the wafer to be processed into the full-cut state can be ensured.

Figure 29:
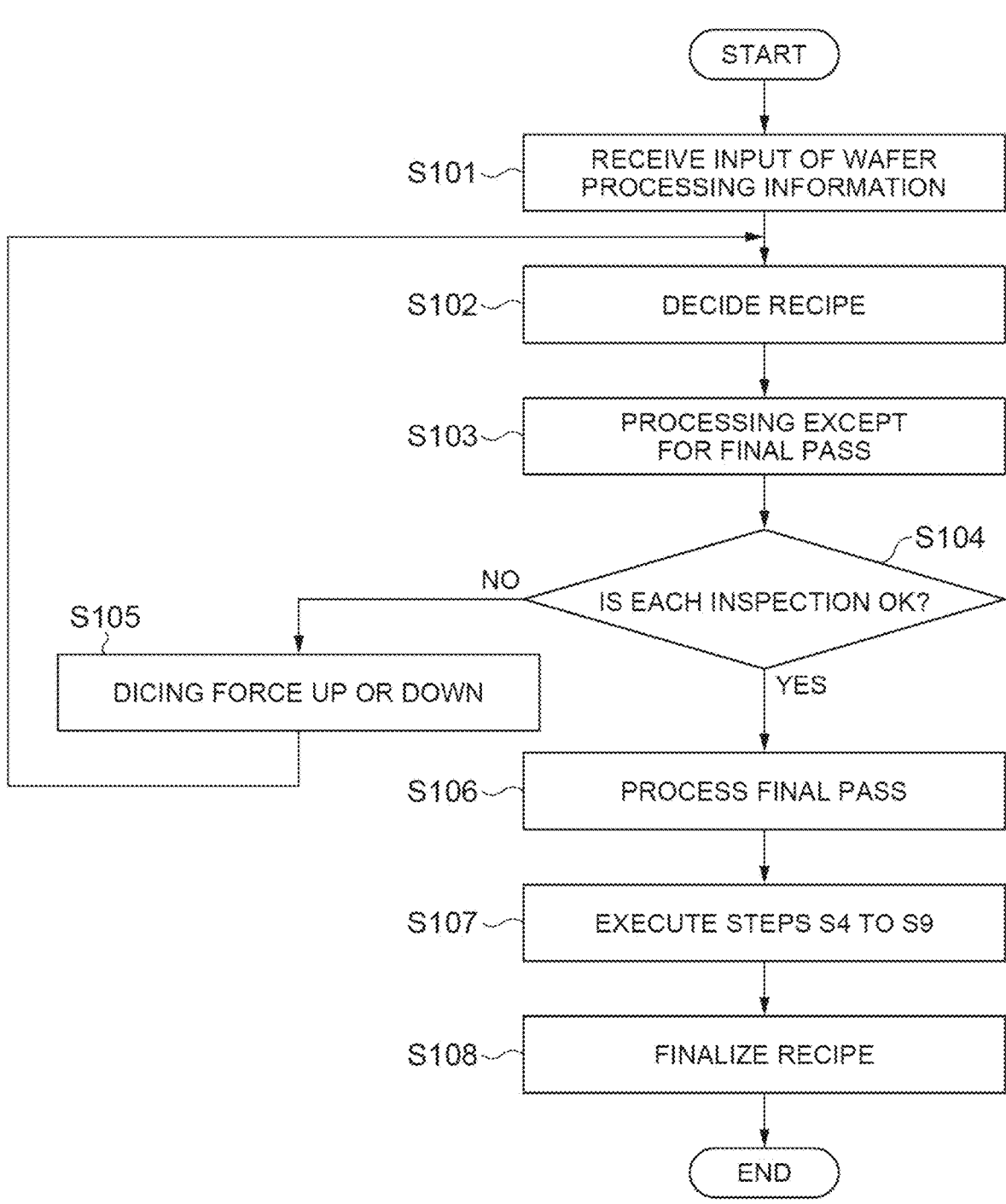
FIG. 29 is a flowchart of an inspection method (processing condition derivation process) according to the modification example.

FIG. 29 is a flowchart of an inspection method (processing condition derivation process) according to the modification example. Specifically, FIG. 29 is a flowchart of a process of executing a determination (FC determination) as to the full-cut state after the pre-determination (FC-1 determination) is executed. As shown in FIG. 29, initially, the display 150 receives a user's input of wafer processing information (step S101). Subsequently, the control unit 8 decides a recipe (processing condition) including laser beam irradiation conditions of the laser irradiation unit 3, based on the information received by the display 150 (step S102). Subsequently, the control unit 8 controls the laser irradiation unit 3 based on the decided recipe, to process the wafer 20 such that the modified regions 12 except for a final pass are formed (step S103).

Subsequently, the control unit 8 executes the pre-identification process and the pre-determination process to determine whether or not a state before the modified region 12 to be formed last is formed is proper (whether or not various inspections are OK) (step S104). When it is determined in step S104 that the various inspections are NG, the control unit 8 corrects the recipe to increase or decrease the dicing force (step S105). When it is determined in step S104 that the various inspections are OK, the control unit 8 causes the wafer 20 to be processed such that the modified region 12 of the final pass is formed (step S106). Then, the control unit 8 executes the processes related to the FC determination (processes of steps S4 to S9 in FIG. 25) (step S107). After the processes related to the FC determination, the control unit 8 finalizes the recipe (step S108).

(Algorithm Related to Determination Based on Internal Observation Result)

Regarding various determinations based on internal observation results described above, an algorithm for detecting (identifying) the crack 14 and an algorithm for detecting (identifying) the mark related to the modified region will be described in detail.

Figure 30:
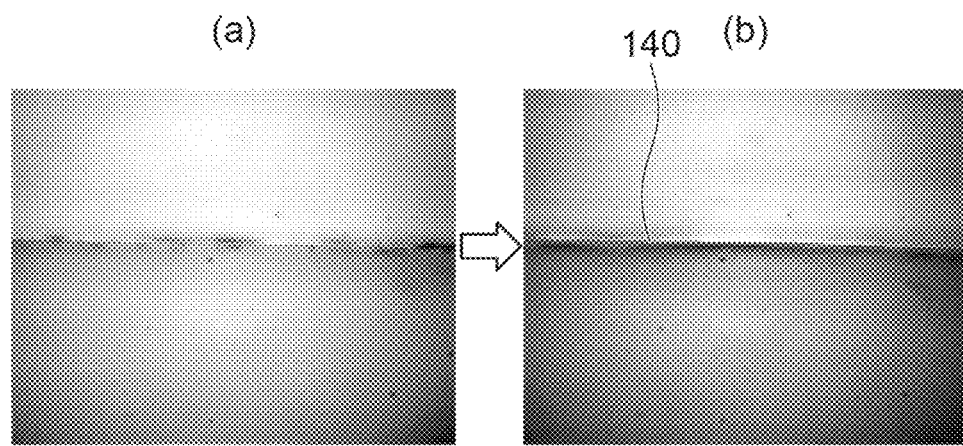
FIG. 30 shows views for describing crack detection.
Figure 31:
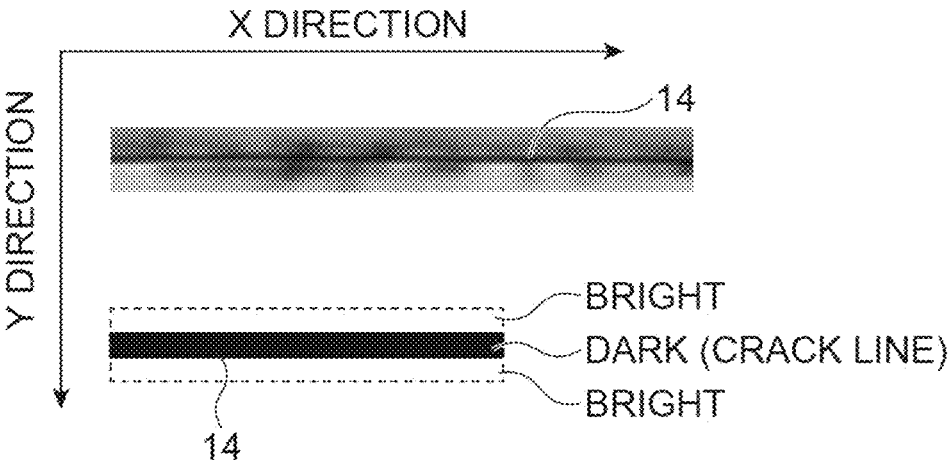
FIG. 31 shows views for describing crack detection.

FIGS. 30 and 31 are views for illustrating crack detection. FIG. 30 shows internal observation results (images of the inside of the wafer 20). First, the control unit 8 detects a straight line group 140 in an image of the inside of the wafer 30 as shown in FIG. 30(*a*). For example, an algorithm such as Hough transform or line segment detector (LSD) is used for the detection of the straight line group 140. The Hough transform is a technique in which as for points on an image, all straight lines passing through the points are detected and a straight line is detected while weighting the straight lines passing through more feature points. The LSD is a technique in which a region that becomes a line segment is estimated by calculating a gradient and an angle of brightness values in an image and a straight line is detected by approximating the region to a rectangular shape.

Subsequently, the control unit 8 detects the crack 14 from the straight line group 140 by calculating a similarity of the straight line group 140 to a crack line as shown in FIG. 31. As shown in an upper view of FIG. 31, the crack line has a characteristic that the front and the rear in the Y direction with respect to a brightness value on the line are very bright.

For this reason, for example, the control unit 8 compares brightness values of all pixels of the detected straight line group 140 to those in the front and in the rear in the Y direction, and sets the number of pixels, of which the difference both in the front and in the rear is a threshold value or more, as a score of the similarity. Then, the straight line group 140 having a highest score of the similarity to the crack line among a plurality of the detected straight line groups 140 is taken as a representative value in the image. An index that the higher the representative value is, the higher the crack 14 is likely to exist is obtained. The control unit 8 compares representative values of a plurality of images to each other to take an image having a relatively high score, as a crack image candidate.

Figure 32:
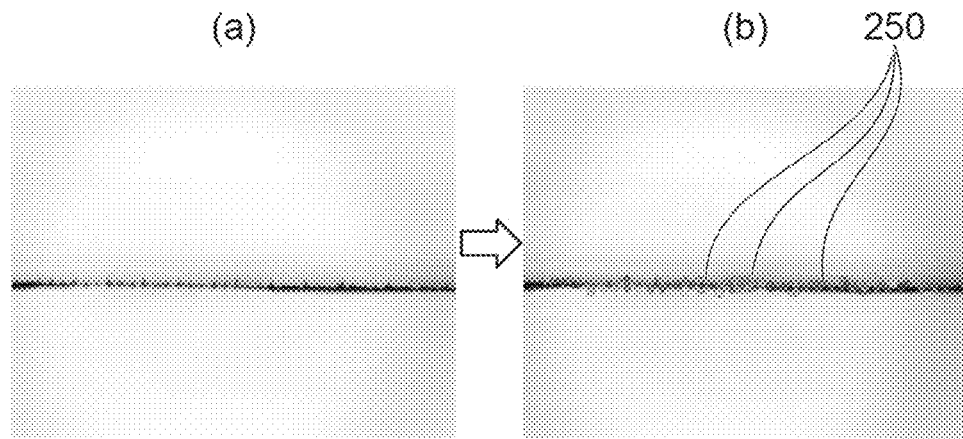
FIG. 32 shows views for describing mark detection.
Figure 33:
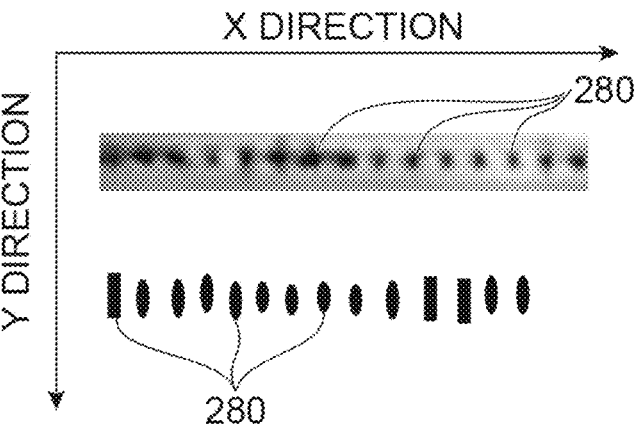
FIG. 33 shows views for describing mark detection.
Figure 34:
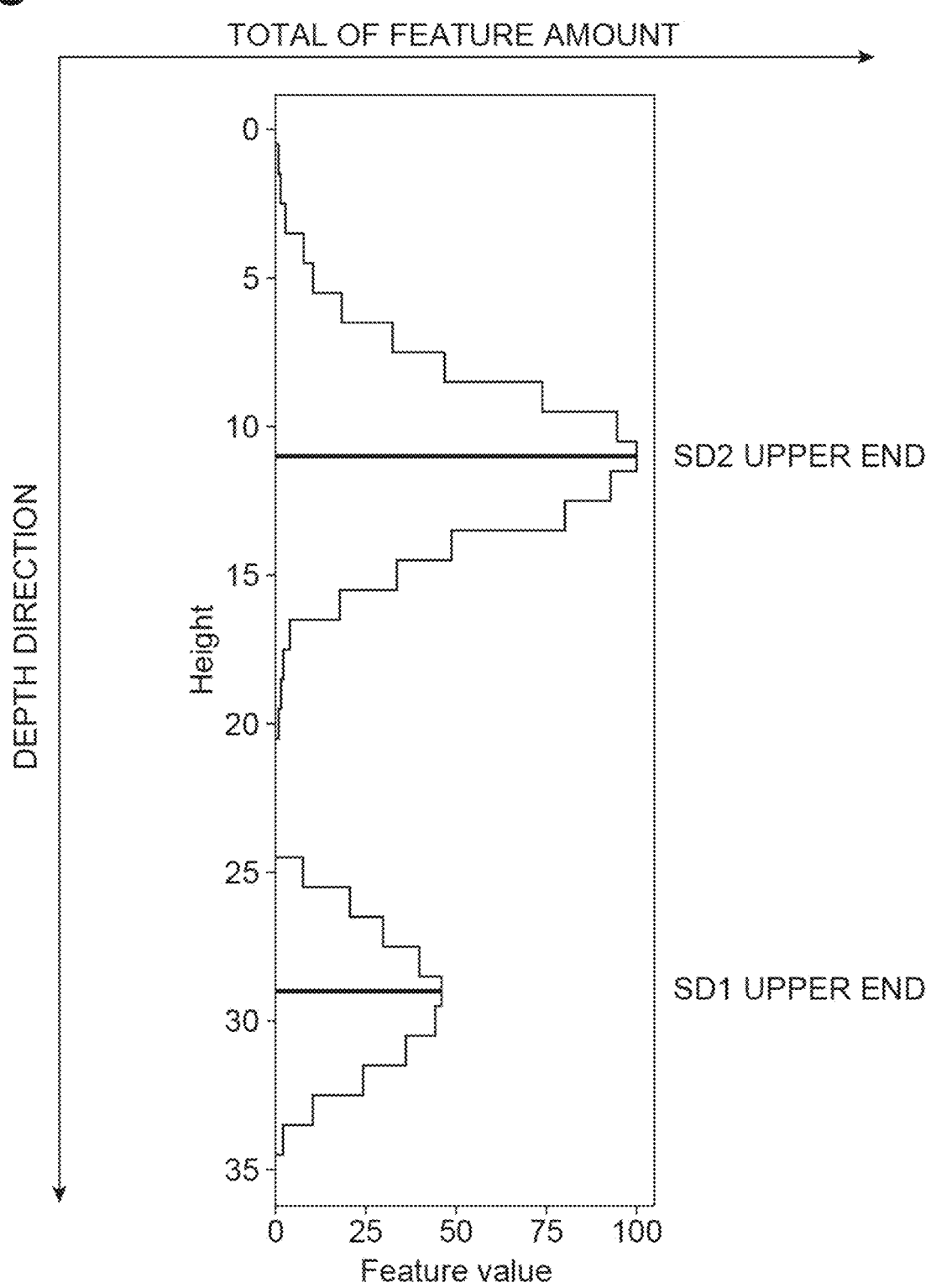
FIG. 34 shows views for describing mark detection.

FIGS. 32 to 34 are views for illustrating mark detection. FIG. 32 shows internal observation results (images of the inside of the wafer 20). In an image of the inside of the wafer 20 as shown in FIG. 32(*a*), the control unit 8 detects corners (concentration of edges) in the image as key points, and detects the positions, the sizes, and the directions thereof to detect feature points 250. As a technique of detecting the feature points in such a manner, Eigen, Harris, Fast, SIFT, SURF, STAR, MSER, ORB, AKAZE, and the like are known.

Here, as shown in FIG. 33, since marks 280 each having a circular shape, a rectangular shape, or the like are arranged at regular intervals, each of the marks 280 has a strong feature as a corner. For this reason, it is possible to detect the marks 280 with high accuracy by summing up feature amounts of the feature points 250 in the image. As shown in FIG. 34, when totals of feature amounts for each image that is captured while shifting the focus in a depth direction are compared to each other, a change in a mountain indicating a crack row amount for each modified layer can be confirmed. The control unit 8 estimates a peak of the change as the position of the mark 280. It is possible to estimate not only the positions of the marks but also a pulse pitch by summing up the feature amounts as described above.

(Adjustment of Setting Related to Internal Observation)

Figure 35:
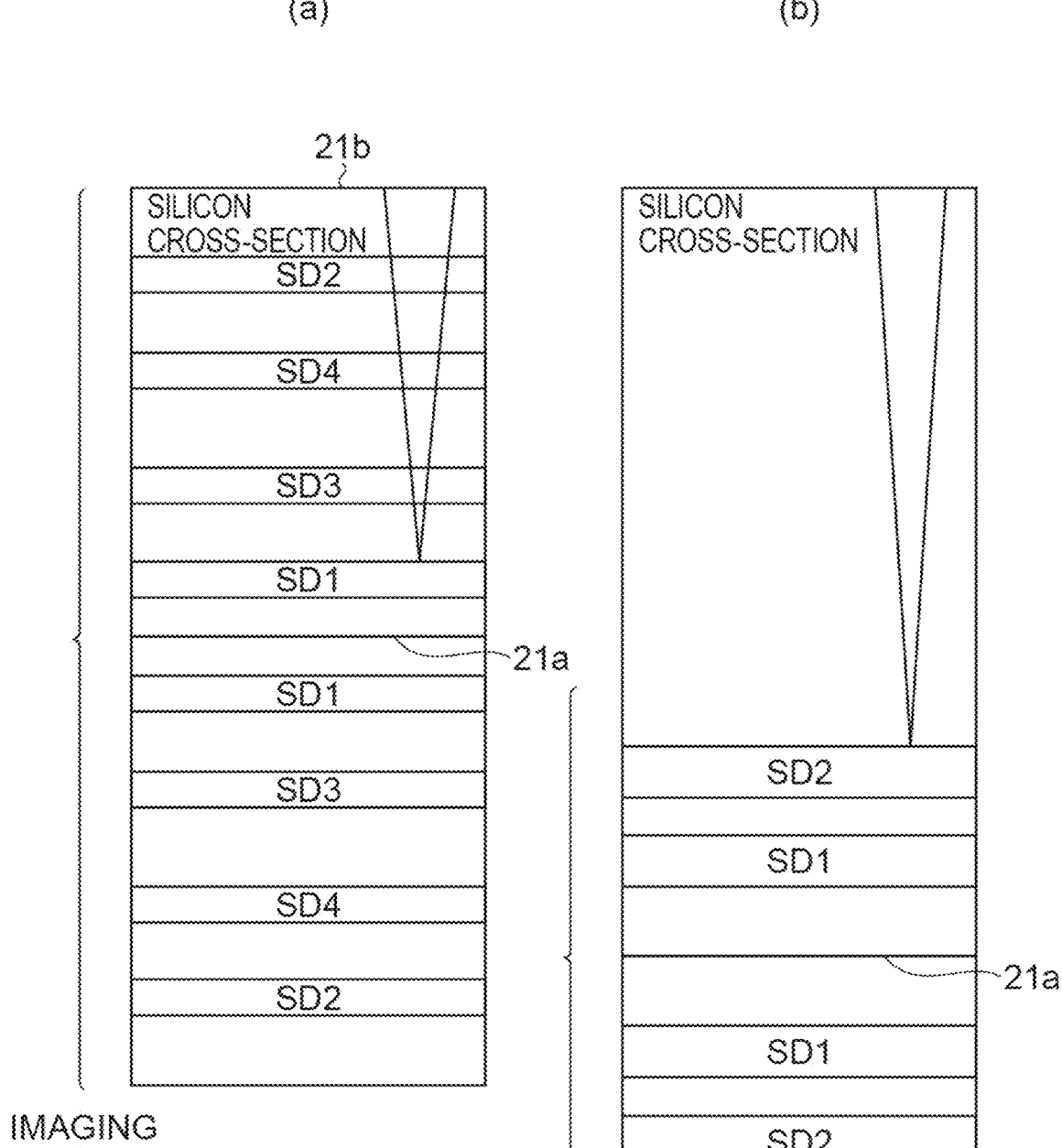
FIG. 35 shows views for describing a difference in an imaging section depending on a processing method.

In addition, for example, a laser processing device may adjust a setting for performing the internal observation of the wafer in more detail. FIG. 35 shows views for illustrating a difference in an imaging section depending on a processing method. FIG. 35(*a*) shows an imaging section when full-cut processing is performed, and FIG. 35(*b*) shows an imaging section when other processing (for example, BHC processing) is performed. In both the processing, an image of an imaginary focus that is symmetric to the surface 21*a* is also captured. Namely, in the wafers of FIGS. 35(*a*) and 35(*b*), the SD layers in a lower half are regions related to the imaginary focus. As shown in FIG. 35, when the full-cut processing is performed, the total imaging section is widened in the thickness direction of the wafer 20. In addition, when the full-cut processing is performed, the interval between the modified regions (SD1 to SD4) becomes narrow, and the extension amount of the crack 14 is also reduced. For this reason, when the full-cut processing is performed, it is considered that unless the adjustment of the setting related to internal observation in the thickness direction of the wafer 20 in more detail or the like is executed, the modified regions and the cracks cannot be clearly observed.

Specifically, the control unit 8 performs the following processes to clearly observe the modified regions and the like even when the full-cut processing is performed.

Firstly, the control unit 8 is configured to further execute an aberration correction process of controlling the imaging unit 4 such that aberration correction according to a position in the thickness direction of the wafer 20 (optimum aberration correction in each thickness direction) is performed in each region in the thickness direction of the wafer 20 of which an image is captured by the imaging unit 4. For example, the control unit 8 executes an optimum aberration correction by adjusting the spatial light modulator 32 or the correction ring 43a of the objective lens 43 in each region corresponding to an SD processing position (modified region formation position) estimated from the processing condition.

Secondarily, the control unit 8 is configured to further execute a brightness calibration process of controlling the imaging unit 4 such that the imaging unit 4 captures an image with a predetermined (for example, constant or optimum) brightness in each region in the thickness direction of the wafer 20 of which an image is captured by the imaging unit 4, and such that the imaging unit 4 outputs light of a light amount corresponding to a position of each region in the thickness direction of the wafer 20. In the internal observation, the deeper the observation depth is, the larger the light amount required to secure sufficient brightness is. Namely, the light amount required for each depth changes. For this reason, it is necessary to figure out a light amount required to obtain an optimum brightness value for each depth each time before observation is performed, when the laser device is started up, or the device is changed. In the brightness calibration process, a light amount when each position in the thickness direction is observed is decided, and setting is done such that the imaging unit 4 outputs light of the light amount during observation of each position.

Figure 36:
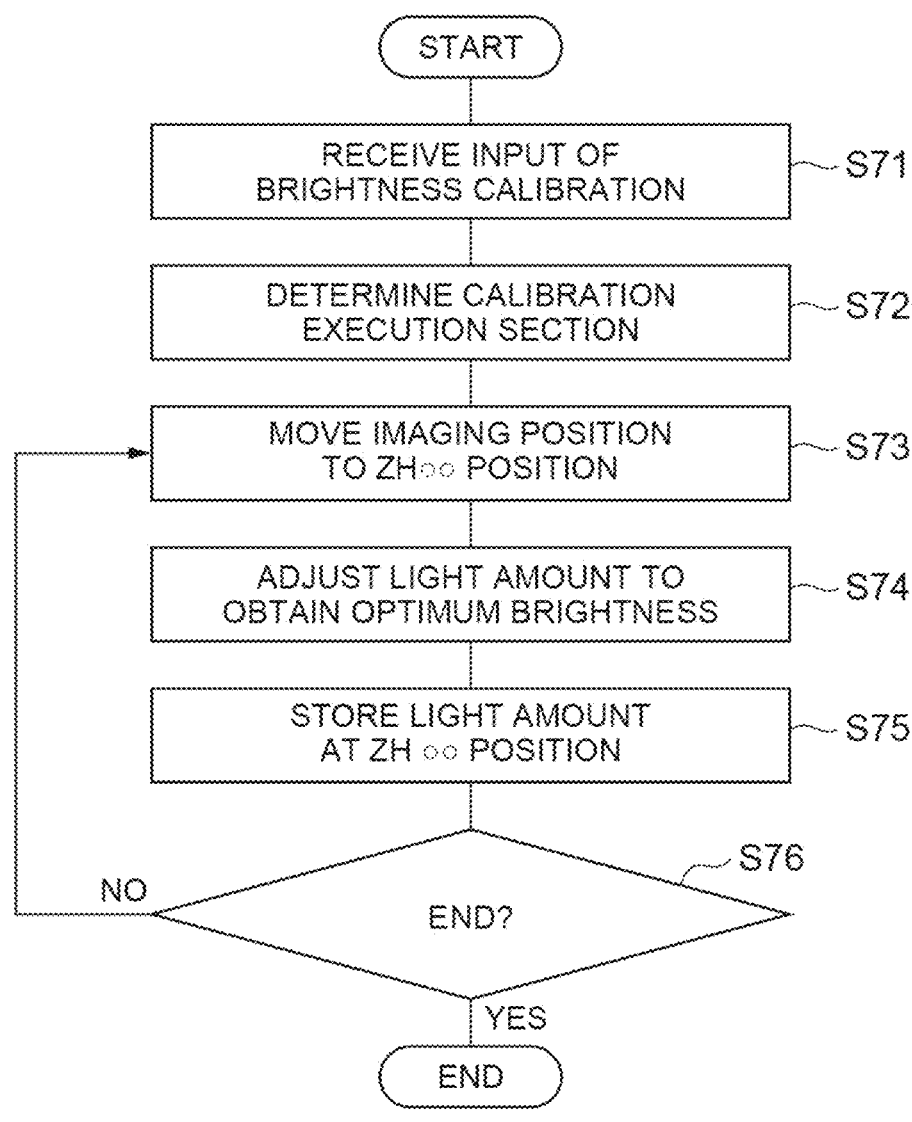
FIG. 36 is a flowchart of a brightness calibration process.

In the brightness calibration process, as shown in FIG. 36, initially, an input related to brightness calibration is received (step S71). The input related to brightness calibration may be, for example, an input of a wafer thickness to be input related to the derivation of the processing condition, or the like. Subsequently, the control unit 8 decides a calibration execution section according to the input (for example, the wafer thickness) related to brightness calibration. The calibration execution section referred to here is, for example, information of a plurality of ZHs at which brightness calibration is executed. Incidentally, the calibration execution section may be decided and input by the user. Subsequently, an imaging position of the imaging unit 4 is set to one ZH of the calibration execution section (step S73). Then, the light amount of the light source 41 is adjusted such that the brightness with which an image at the ZH is captured is an optimum brightness (step S74), and the ZH and the light amount are stored in association with each other (step S75). An aperture diaphragm or the like is used for the adjustment of the light source 41. The processes of steps S73 to S75 are executed until the adjustment of the light amount for all the ZHs is completed. Then, the light amount adjusted in such a manner is output from the light source 41 of the imaging unit 4 during observation of each position, so that the observation of each position can be performed with an appropriate brightness.

Thirdly, the control unit 8 is configured to further execute a shading correction process of controlling the imaging unit 4 to capture an image for shading in each region in the thickness direction of the wafer 20 of which an image is captured by the imaging unit 4, before the modified regions are processed, and of identifying difference data between the image of each region and the image for shading of the corresponding region captured by the imaging unit 4, after the modified regions are processed. In this case, the control unit 8 identifies a state related to each modified region based on the difference data.

Figure 37:
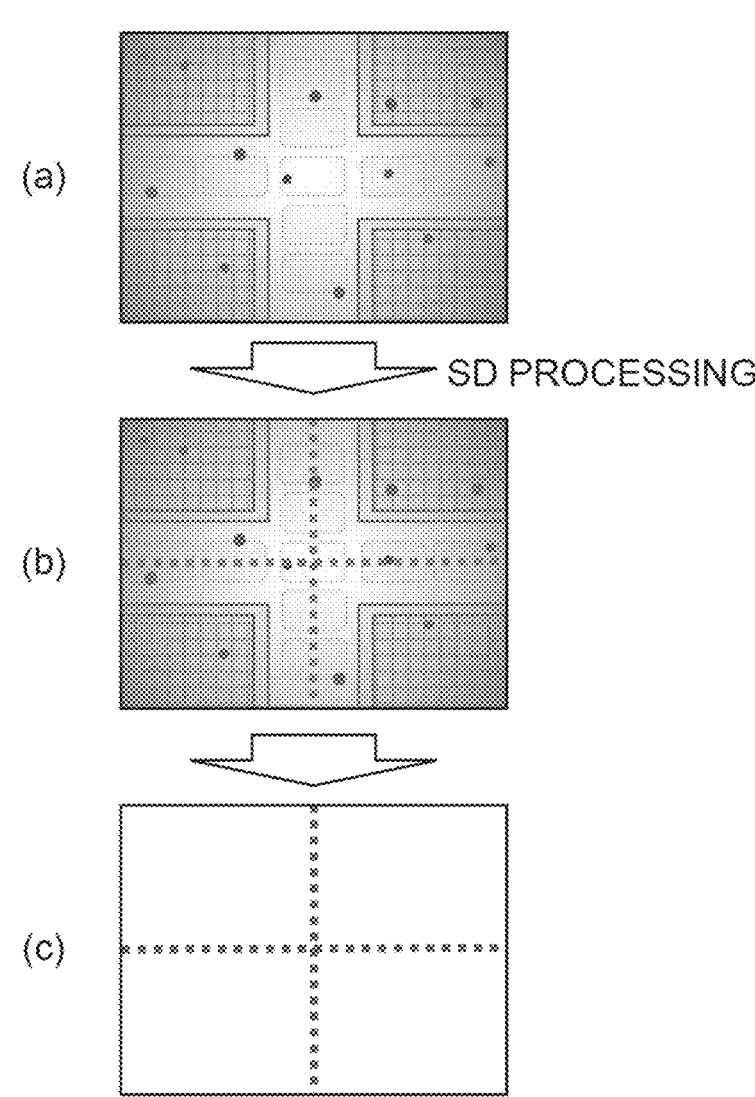
FIG. 37 is a flowchart of a shading correction process.

In the shading correction process, as shown in FIG. 37(a), an image for shading at each internal observation position (determination position) is acquired before SD processing (processing of the modified regions). Then, the SD processing is performed, and an image after the SD processing as shown in FIG. 37(b) is acquired at each internal observation position (determination position). Then, difference data between the image after the SD processing and the image for shading (refer to FIG. 37(c)) is acquired at each internal observation position (shading correction is executed). Incidentally, when there is a positional offset between the image after the SD processing and the image for shading, correction may be executed according to an offset amount. Things to be shaded by the shading correction are, for example, a device pattern, point defects, uneven screen brightness, and the like.

Figure 38:
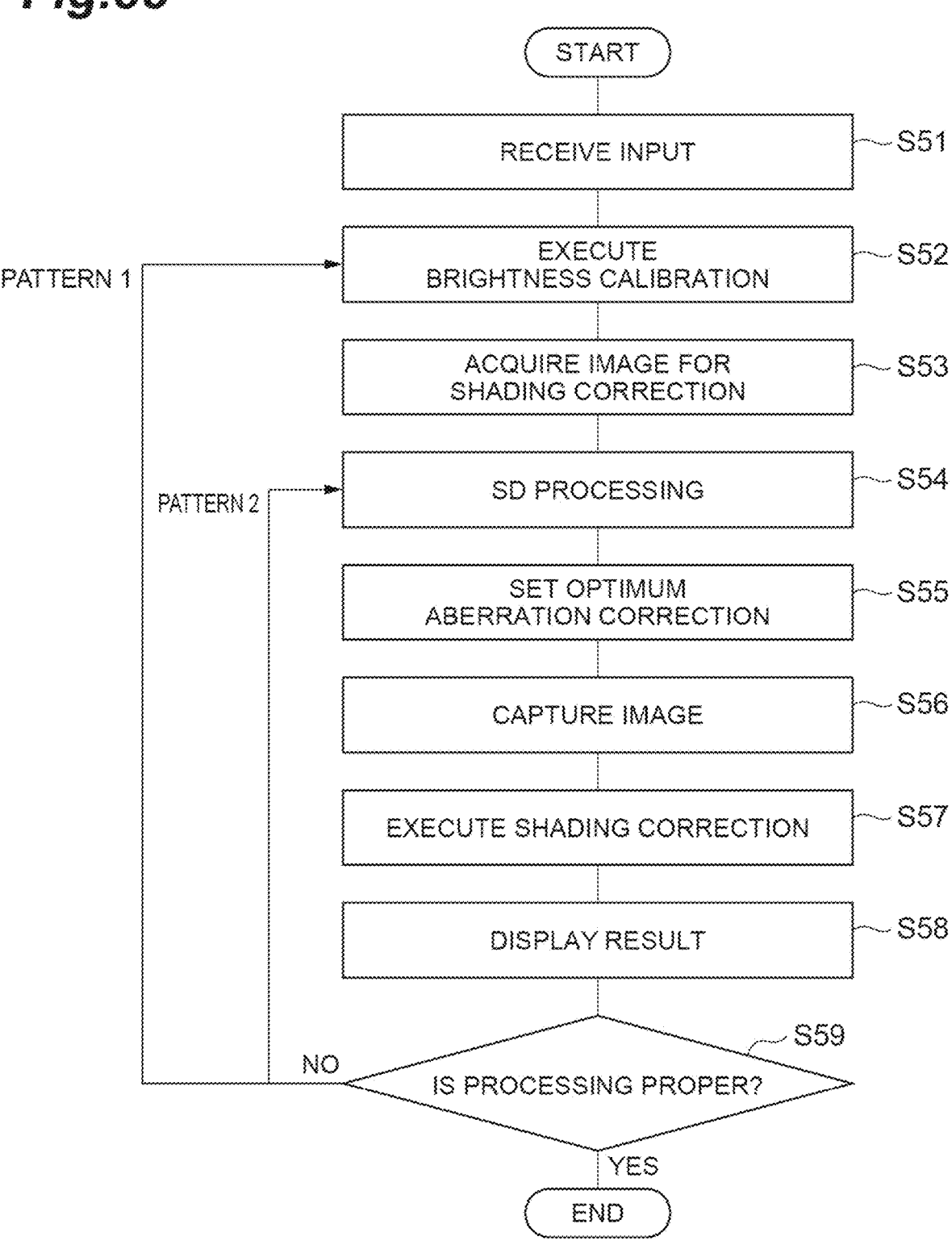
FIG. 38 is a flowchart of a laser processing method (processing condition derivation process) when various correction processes are performed.

A laser processing method (processing condition derivation process) in the case of executing the aberration correction process, the brightness calibration process, and the shading correction process described above will be described with reference to FIG. 38. Incidentally, in FIG. 38, the processing process and the determination process are described in a simplified manner. As shown in FIG. 38, initially, the display 150 receives a user's input of wafer processing information (step S51). Specifically, the display 150 receives an input of information of at least the wafer thickness. Accordingly, the processing condition is automatically and provisionally decided.

Subsequently, the control unit 8 executes the brightness calibration process (step S52). Specifically, the control unit 8 sets the imaging unit 4 such that the imaging unit 4 captures an image with a predetermined (for example, constant or optimum) brightness in each region in the thickness direction of the wafer 20 of which an image is captured by the imaging unit 4, and such that the imaging unit 4 outputs light of a light amount corresponding to a position of each region in the thickness direction of the wafer 20.

Subsequently, the control unit 8 acquires an image for shading correction (image for shading) (step S53). Specifically, the control unit 8 acquires an image at each internal observation position before SD processing, as the image for shading.

Subsequently, the control unit 8 controls the laser irradiation unit 3 based on the processing condition, to process SD layers in the wafer 20 (step S54). Subsequently, the control unit 8 executes aberration correction according to the position in the thickness direction of the wafer 20 (step S55). For example, the control unit 8 executes an optimum aberration correction by adjusting the spatial light modulator 32 or the correction ring 43a of the objective lens 43 in each region corresponding to an SD processing position (modified region formation position) estimated from the processing condition.

Subsequently, an image of the processed wafer 20 is captured by the imaging unit 4 (step S56). The control unit 8 executes shading correction (step S57). Specifically, the control unit 8 acquires difference data between the image of each region and the image for shading of the corresponding region captured by the imaging unit 4.

Then, the control unit 8 controls the display 150 such that imaging results are displayed on the display 150 (step S58). Subsequently, the control unit 8 identifies a state related to each SD layer based on the imaging results, and determines whether or not the processing is proper (namely, whether or not the processing condition is proper), based on the identified information (step S59). The control unit 8 performs the determination process referred to here, using difference data after the shading correction. When it is determined in step S59 that the processing condition is not proper, the control unit 8 receives an input of a new processing condition, and executes the processing process again. In this case, as shown in FIG. 38, the processing process may be executed from the brightness calibration process (step S52) again or may be executed from the SD processing (step S54) again. On the other hand, when the processing condition is proper, the control unit 8 finally decides the processing condition as a processing condition, and the process ends.

As described above, the control unit 8 is configured to further execute the brightness calibration process of controlling the imaging unit 4 such that the imaging unit 4 captures an image with a predetermined brightness in each region in the thickness direction of the wafer 20 of which an image is captured by the imaging unit 4, and such that the imaging unit 4 outputs light of a light amount corresponding to a position of each region in the thickness direction of the wafer 20. According to such a configuration, the light amount of the imaging unit 4 can be decided such that a constant or optimum brightness is obtained for each imaging region in the thickness direction (depth direction) of the wafer 20. Accordingly, the state related to each modified region can be appropriately identified.

The control unit 8 is configured to further execute the shading correction process of controlling the imaging unit 4 to capture an image for shading in each region in the thickness direction of the wafer 20 of which an image is captured by the imaging unit 4, before the modified regions are processed, and of identifying difference data between the image of each region and the image for shading of the corresponding region captured by the imaging unit 4, after the modified regions are processed. In the determination process, the state related to each modified region is identified based on the difference data. The difference data acquired by the shading correction process is image data from which noise such as a device pattern, point defects, or uneven screen brightness is removed, and is image data of only modified regions, a crack state, and the like that are desired to be observed. The state related to each modified region is identified based on such difference data, so that a state of the wafer 20 after the processing is appropriately identified. Accordingly, the quality of the wafer 20 after the processing can be more suitably ensured.

The control unit 8 is configured to further execute the aberration correction process of controlling the imaging unit 4 such that aberration correction according to a position in the thickness direction of the wafer 20 is performed in each region in the thickness direction of the wafer 20 of which an image is captured by the imaging unit 4. For example, when full-cut processing is performed, the interval between the modified regions becomes narrow, and the extension amount of the crack is also reduced, so that clear observation cannot be performed unless aberration correction is performed for each position in the thickness direction of the wafer 20. In this respect, as described above, since aberration correction according to the thickness of the wafer 20 is performed in each region in the thickness direction of the wafer 20, clear observation can be performed, and a state related to each modified region can be more appropriately identified.

Figure 39:
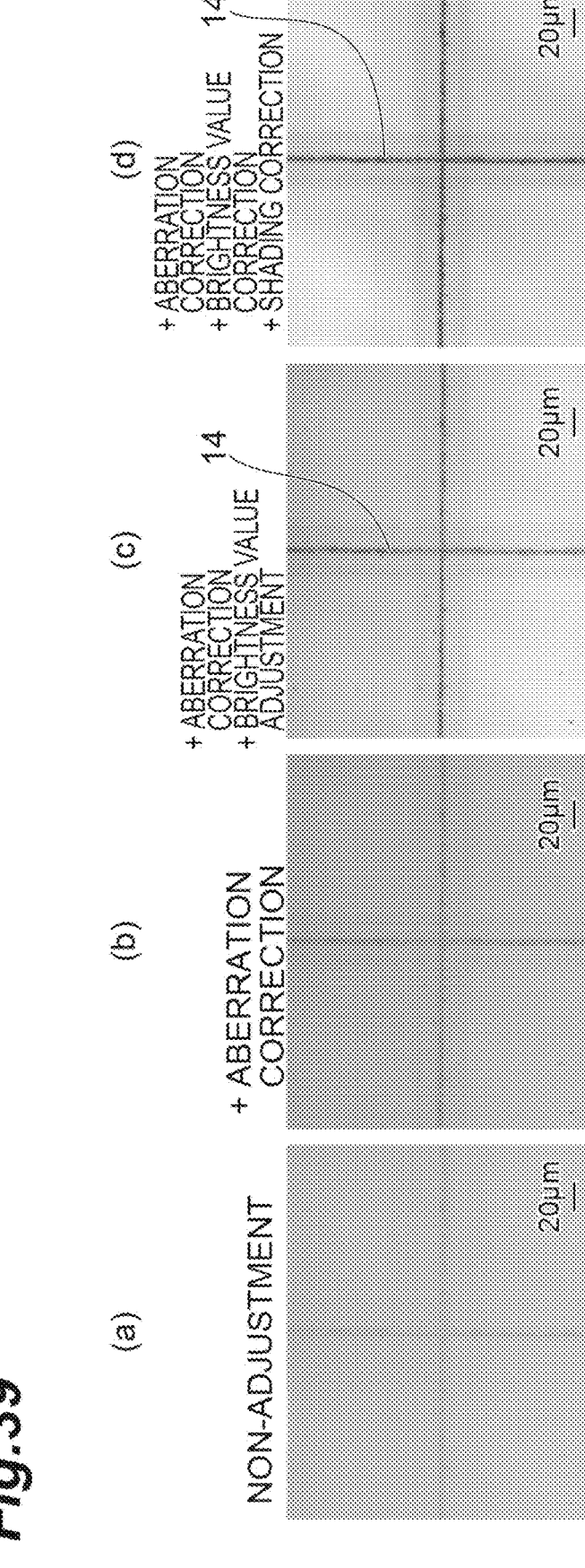
FIG. 39 shows images on which various correction processes are performed.

FIG. 39 shows images for illustrating effects obtained by executing the aberration correction process, the brightness value calibration process, and the shading correction process. FIG. 39(a) is an image when none of these processes is performed, FIG. 39(b) is an image when only the aberration correction process is performed, FIG. 39(c) is an image when the aberration correction process and the brightness value calibration process are performed, and FIG. 39(d) is an image when the aberration correction process, the brightness value calibration process, and the shading correction process are performed. As shown in FIG. 39, it can be seen that the clearness of the cracks 14 and the like are greatly improved by performing these processes.

(Regarding Automation of Processing Condition Derivation Process)

In the above-described embodiment, a final processing condition is derived by automatically deriving a provisional processing condition through inputting wafer processing information, by automatically deriving and displaying an image of an estimated processing result based on the processing condition, by displaying an image of an actual processing result, and by performing correction on the processing condition until the actual processing result coincides with the estimated processing result. However, all of such a processing condition derivation process may not be automatically executed.

For example, in a first step for automating the processing condition derivation process, the user may manually generate and set a processing condition (provisional processing condition) based on wafer processing information. Then, an actual processing result under the generated processing condition may be acquired, and each combination of the input wafer processing information and the processing condition that is manually generated may be stored in a database in association with the actual processing result.

Furthermore, in a second step, a model for deriving an estimated processing result from the wafer processing information and from the processing condition may be generated by learning information stored in the database. Then, a regression model for deriving an optimum (the most accurate) estimated processing result from the wafer processing information and from the processing condition may be generated by analyzing data in the above-described database. In this case, multivariate analysis or machine learning may be used as an analysis technique. Specifically, analysis techniques such as simple regression, multiple regression, SGD regression, Lasso regression, Ridge regression, decision tree, support vector regression, Bayesian linear regression, deep machine learning, and k-nearest neighbors method may be used.

Furthermore, in a third step, a regression model for automatically deriving an optimum processing condition (recipe) for obtaining a target processing result, from the input wafer processing information may be generated. Namely, parameters of the processing condition may be input to the regression model while being adjusted with respect to the input wafer processing information, and the optimum processing condition that outputs the target processing result may be searched. For example, techniques such as grid search, random search, and Bayesian optimization can be used as such an optimization technique.

Furthermore, in a fourth step, when the needs for the correction of the conditions are determined by comparing a simulation result (estimated processing result) and an actual processing result to each other, the data may be stored in the database, and a regression model (active learning) may be generated again, so that the accuracy of the regression model is improved through actual operation. As described above, the accuracy of the regression model can be improved by feedbacking the actual processing result through correcting the processing condition from a difference between the estimated processing result and the actual processing result.

REFERENCE SIGNS LIST

1: inspection device, 3: laser irradiation unit, 4: imaging unit, 8: control unit, 20: wafer, 150: display.

The invention claimed is:

1. An inspection device comprising:

an irradiation unit configured to irradiate a wafer having a first surface and a second surface with a laser beam from a first surface side of the wafer;

an imaging unit configured to output light having a property of transmitting through the wafer, and detect the light that has propagated through the wafer; and a control unit, wherein the control unit is configured to execute a first process of controlling the irradiation unit according to a processing condition set such that one or a plurality of modified regions are formed inside the wafer by irradiating the wafer with the laser beam and a full-cut state where cracks extending from the modified regions have reached the first surface and the second surface is attained; a second process of identifying a state of the crack on the first surface extending from the modified region, and a state of at least one of the modified regions and the cracks inside the wafer, based on a signal output from the imaging unit that has detected the light; and a third process of determining whether or not a dicing force applied to the wafer according to the processing condition is proper, based on information identified in the second process, and wherein the control unit identifies a meandering width of the crack in a direction intersecting a thickness direction of the wafer inside the wafer in the second process, and determines that the dicing force is out of a proper range and is not proper, when the identified meandering width of the crack is larger than a predetermined value, in the third process.

2. The inspection device according to claim 1, wherein in the second process, the control unit decides a position inside the wafer at which meandering of the crack is assumed to be likely to occur, according to information regarding the wafer, and identifies a meandering width of the crack at the decided position.

3. An inspection device comprising:

an irradiation unit configured to irradiate a wafer having a first surface and a second surface with a laser beam from a first surface side of the wafer;

an imaging unit configured to output light having a property of transmitting through the wafer, and detect the light that has propagated through the wafer; and a control unit, wherein the control unit is configured to execute a first process of controlling the irradiation unit according to a processing condition set such that one or a plurality of modified regions are formed inside the wafer by irradiating the wafer with the laser beam and a full-cut state where cracks extending from the modified regions have reached the first surface and the second surface is attained; a second process of identifying a state of the crack on the first surface extending from the modified region, and a state of at least one of the modified regions and the cracks inside the wafer, based on a signal output from the imaging unit that has detected the light; and a third process of determining whether or not a dicing force applied to the wafer according to the processing condition is proper, based on information identified in the second process, and wherein the control unit identifies a clearness of a mark of the laser beam related to the modified region in the second process, and determines that the dicing force has not reached a proper range and is not proper, when the identified clearness of the mark is higher than a predetermined value, in the third process.

4. An inspection device comprising:

an irradiation unit configured to irradiate a wafer having a first surface and a second surface with a laser beam from a first surface side of the wafer;

an imaging unit configured to output light having a property of transmitting through the wafer, and detect the light that has propagated through the wafer; and a control unit, wherein the control unit is configured to execute a first process of controlling the irradiation unit according to a processing condition set such that one or a plurality of modified regions are formed inside the wafer by irradiating the wafer with the laser beam and a full-cut state where cracks extending from the modified regions have reached the first surface and the second surface is attained; a second process of identifying a state of the crack on the first surface extending from the modified region, and a state of at least one of the modified regions and the cracks inside the wafer, based on a signal output from the imaging unit that has detected the light; and a third process of determining whether or not a dicing force applied to the wafer according to the processing condition is proper, based on information identified in the second process, and wherein the control unit identifies a meandering width of the crack on the first surface in a direction intersecting a thickness direction of the wafer in the second process, and determines that the dicing force is out of a proper range and is not proper, when the identified meandering width of the crack is larger than a predetermined value, in the third process.

5. The inspection device according to claim 4, wherein the control unit identifies a reach state of the crack on the first surface in the second process, and determines that the dicing force has not reached a proper range and is not proper, when the identified reach state of the crack is a stealth state where the crack has not reached the first surface, in the third process.

6. The inspection device according to claim 4, wherein the control unit identifies a reach state of the crack on the second surface in the second process, and determines that the dicing force has not reached a proper range and is not proper, when the identified reach state of the crack is a stealth state where the crack has not reached the second surface, in the third process.

7. The inspection device according to claim 4, wherein the control unit is configured to further execute a fourth process of correcting the processing condition to set the dicing force within a proper range, when it is determined in the third process that the dicing force is not proper, and executes the first process, the second process, and the third process again according to the processing condition corrected in the fourth process.

8. The inspection device according to claim 4, wherein the control unit controls the irradiation unit to form the plurality of modified regions in the first process, and executes the second process and the third process after the modified region to be formed last in the first process is formed.

9. An inspection device comprising:

an irradiation unit configured to irradiate a wafer having a first surface and a second surface with a laser beam from a first surface side of the wafer;

an imaging unit configured to output light having a property of transmitting through the wafer, and detect the light that has propagated through the wafer; and a control unit, wherein the control unit is configured to execute a first process of controlling the irradiation unit according to a processing condition set such that a plurality of modified regions are formed inside the wafer by irradiating the wafer with the laser beam and a full-cut state where cracks extending from the modified regions have reached the first surface and the second surface is attained; a pre-identification process of identifying information related to the modified regions and to the cracks extending from the modified regions, based on a signal output from the imaging unit that has detected the light, before the modified region to be formed last in the first process is formed; and a pre-determination process of determining whether or not a state before the modified region to be formed last is formed is proper, based on the information identified in the pre-identification process.

10. The inspection device according to claim 9, wherein the control unit is configured to further execute a pre-correction process of correcting the processing condition when it is determined in the pre-determination process that the state before the modified region to be formed last is formed is not proper, and wherein the controller executes the first process, the pre-identification process, and the pre-determination process again according to the processing condition corrected in the pre-correction process.

\* \* \* \* \*